(12) United States Patent
Kaise et al.

(10) Patent No.: US 6,296,977 B1
(45) Date of Patent: Oct. 2, 2001

(54) METHOD FOR THE MEASUREMENT OF ABERRATION OF OPTICAL PROJECTION SYSTEM

(75) Inventors: Koji Kaise; Toshio Tsukakoshi; Tsunehito Hayashi, all of Saitama-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/432,791

(22) Filed: Nov. 3, 1999

Related U.S. Application Data

(63) Continuation of application No. 08/995,018, filed on Dec. 19, 1997, now abandoned.

(30) Foreign Application Priority Data

Dec. 19, 1996 (JP) .................................. 8-339703
Dec. 19, 1996 (JP) .................................. 8-339704

(51) Int. Cl.$^7$ ................................. G03F 9/00; G03C 5/00
(52) U.S. Cl. ................................................ 430/30; 430/22
(58) Field of Search .................................. 430/5, 22, 30; 356/399, 400, 401

(56) References Cited

U.S. PATENT DOCUMENTS

| | | | |
|---|---|---|---|
| 4,908,656 | 3/1990 | Suwa et al. | 355/53 |
| 5,402,224 | 3/1995 | Hirukawa et al. | 356/124 |
| 5,434,026 | 7/1995 | Takatsu et al. | 430/30 |
| 5,615,006 | 3/1997 | Hirukawa et al. | 356/124 |
| 5,616,006 | 4/1997 | Castel | 417/54 |
| 5,656,403 | 8/1997 | Shieh | 430/30 |
| 5,699,282 | 12/1997 | Allen et al. | 430/22 |
| 5,750,294 | 5/1998 | Hasegawa et al. | 430/22 |
| 5,800,951 | 9/1998 | Hashimoto | 430/5 |
| 5,888,675 | 3/1999 | Moore et al. | 430/5 |

FOREIGN PATENT DOCUMENTS

| | | |
|---|---|---|
| 0 355 496 | 2/1990 | (EP) . |
| 5-114542 | 5/1993 | (JP) . |
| 5-118957 | 5/1993 | (JP) . |
| 5-217872 | 8/1993 | (JP) . |
| 6-117831 | 4/1994 | (JP) . |
| 6-120117 | 4/1994 | (JP) . |
| 96/04592 | 2/1996 | (WO) . |

OTHER PUBLICATIONS

Grassmann, Andreas et al.; "Contrast transfer function measurements of deep ultraviolet steppers"; *Journal of Vacuum Science & Technology B;* Nov./Dec. 1992; vol. No. 6; New York, US; pp. 3008–3011.

European Patent Office Communication for European Patent Application No. 973010287.4–2208 w/ European Search Report dated Oct. 5, 1999.

*Primary Examiner*—S. Rosasco
(74) *Attorney, Agent, or Firm*—Armstrong, Westerman, Hattori, McLeland & Naughton LLP

(57) ABSTRACT

The aberration measurement method can determine an aberration from a width of an image of a pattern line on a resist or from a ratio of light quantities upon measuring an amount of the aberration of the image formed by an optical projection system. This method further can measure an amount of a deviation of a position of the image of the pattern on the resist so that it can solve laborious work otherwise required by conventional technology that uses a complicated microscope such as a scanning-type electronic microscope. Moreover, the aberration can be determined by measuring a pitch width of a whole line-and-space pattern containing wedge-shaped lines or lengths of the wedge-shaped lines. This does not require to learn the absolute position of the image because a difference between the amounts of deviation of the positions of the different pattern images so that no such complicated microscope is not required. In addition, as an error of superimposition of the patterns can be corrected by an image of a comparison pattern, no laborious attention is any longer paid to alignment of the patterns, thereby allowing a measurement of the amount of the aberration with an optical projection system or by other means at a high speed and with high precision.

27 Claims, 19 Drawing Sheets

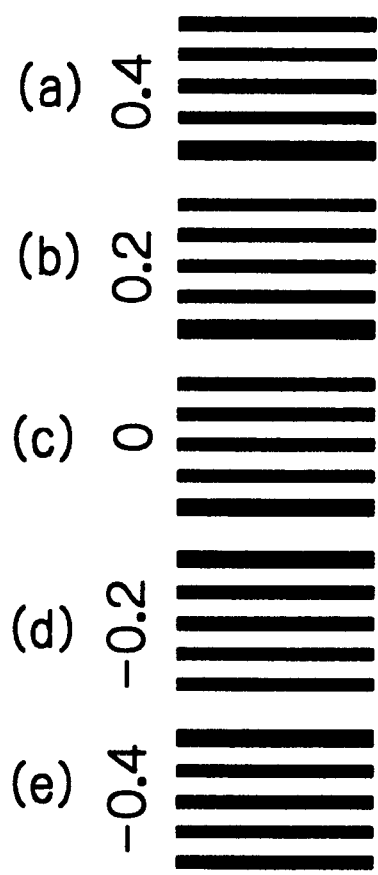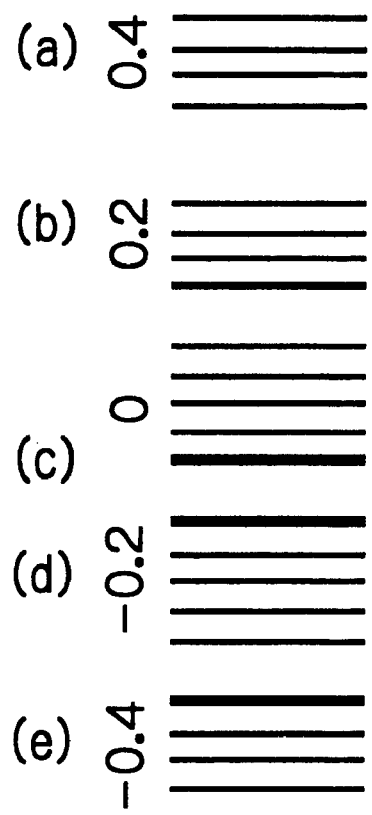
Fig. 2A
Fig. 2B

Fig. 10
(a)
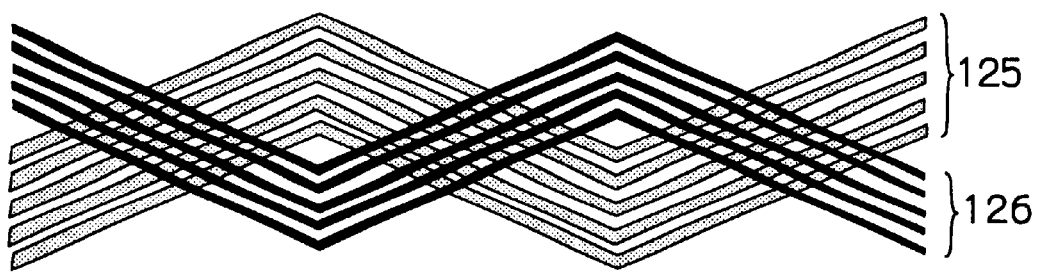
(b)
(c)
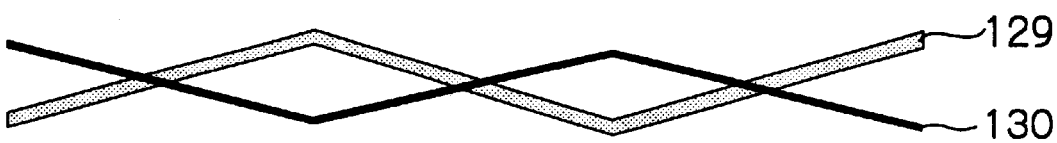
Fig. 11
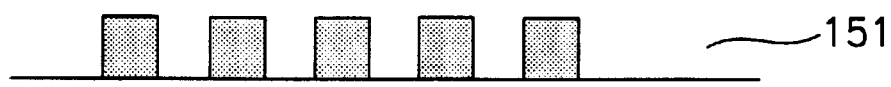
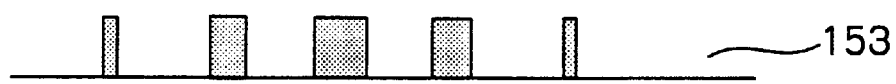

Fig. 16
(a)
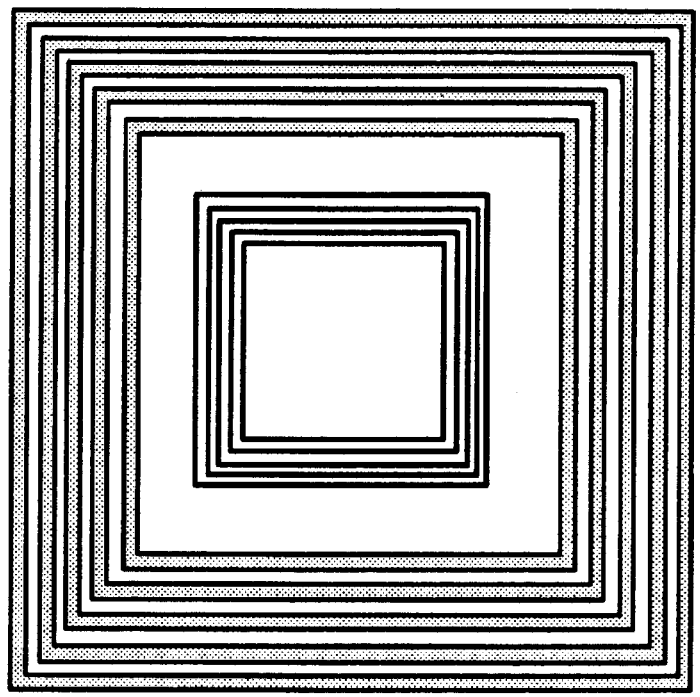
(b)
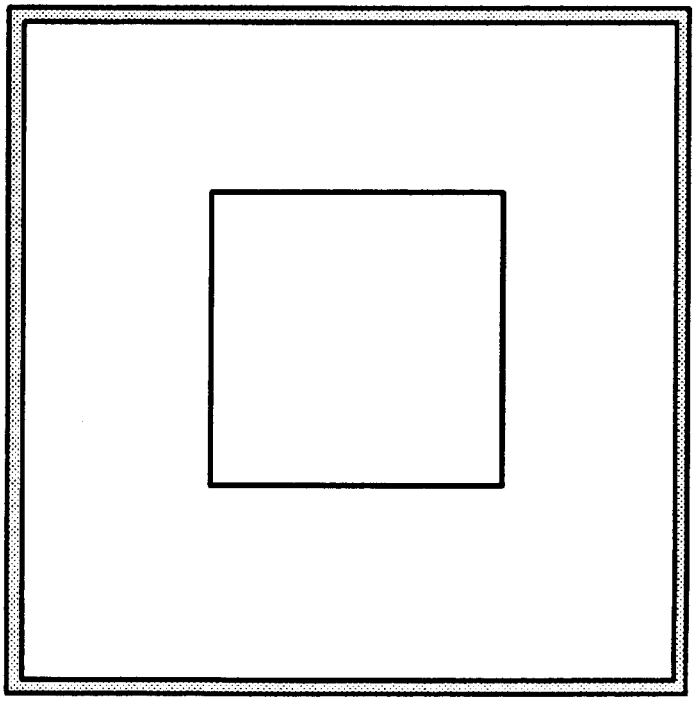

Fig. 19
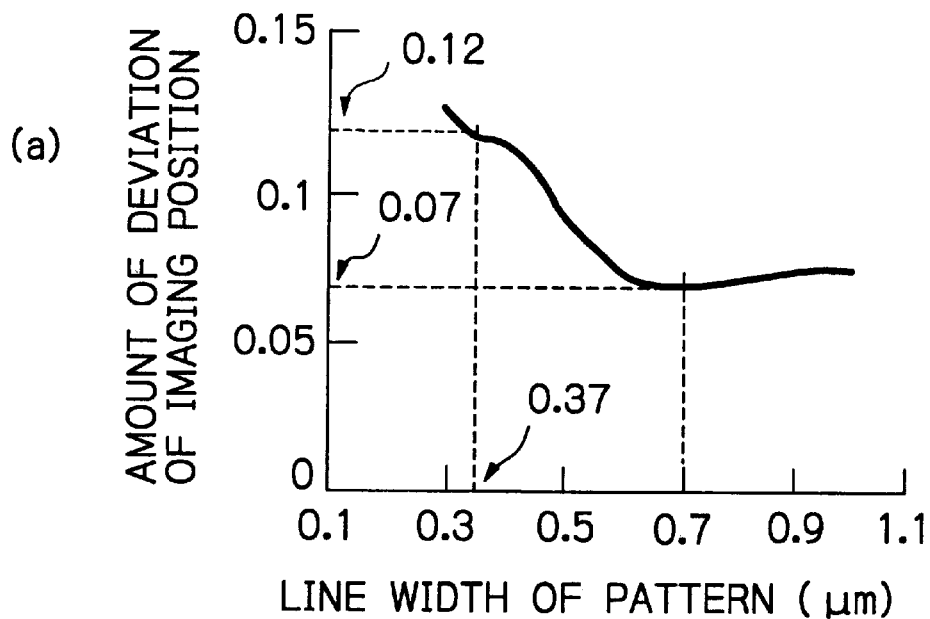
(a)
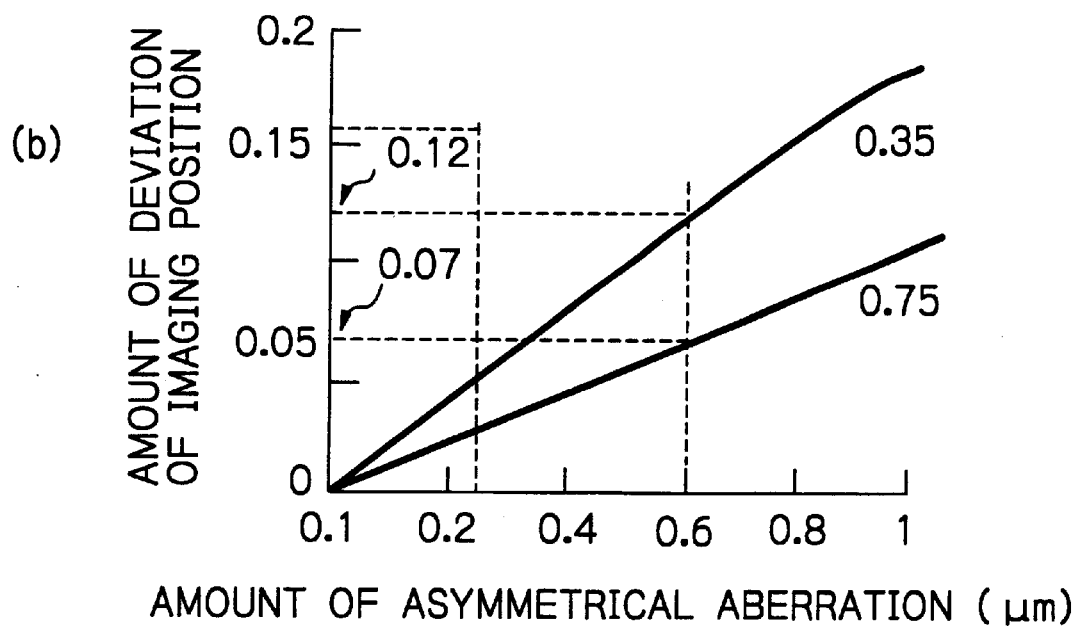
(b)

METHOD FOR THE MEASUREMENT OF ABERRATION OF OPTICAL PROJECTION SYSTEM

This application is a continuation of Ser. No. 08/995,018 Dec. 19, 1997 now abondoned.

BACKGROUND OF INVENTION

1. Field of the Invention

The present invention relates to a method for the measurement of an aberration of an optical projection system and, more particularly, to an aberration measurement method for measuring an aberration of an optical projection system of a projection exposure apparatus to be utilized in particular for the manufacture of devices such as semiconductor elements and liquid crystal display elements.

2. Description of the Related Art

As the extent of integration of circuit patterns for semiconductor elements and so on develops greater and greater, the structure of such patterns is being made finer and finer from year to year. Accordingly, an exposure apparatus of a projection type for resolving a pattern should be developed so as to catch up with developments of making the pattern finer and making the exposing wavelength from 365 nm to 248 nm. At the same time, various aberrations of an optical projection system of the exposure apparatus should be made considerably less because of such developments.

Hitherto, the measurement of an asymmetrical aberration of a projection lens, which includes a comatic aberration of a projection lens and a comatic aberration caused by eccentricity of a mechanical center of the projection lens from the light axis, has been made by locating a light shade pattern at a light transmission section on a reticle in such a state where the projection lens is disposed in the projection exposure apparatus, transcribing the light shade pattern onto a substrate coated with a photoresist and then inspecting an asymmetrical amount of the photoresist image of the pattern transcribed with an electronic microscope or other means.

In order to inspect such an asymmetrical amount of the photoresist image, however, a measuring device having a resolving power of 0.005 $\mu$m is required and only a scanning type electronic microscope (SEM) of the latest type can meet such requirements. The SEM may cause problems, however, in that the resolving power thereof may vary with alignment of the optical axis of an optical electronic system or pressure of inner gases, i.e., a degree of vacuum, or other conditions and, therefore, that the resolving power of the SEM may vary with the ability of researchers who handle it, the state of the apparatus, or the like. Further, the difference of the resolving power can exert a big influence upon an amount of an aberration to be measured.

SUMMARY OF THE INVENTION

Therefore, the present invention has an object to provide a method for the measurement of an amount of an aberration of an optical projection system at a high speed and with a high degree of precision, without using any complicated microscope.

Another object of the present invention is to provide an aberration measurement method of an optical projection system, which can be effected by an optical microscope, by determining an amount of an aberration on the basis of a difference between line widths of patterns.

A further object of the present invention is to provide the aberration measurement method which can be effected by an optical microscope by determining an amount of an aberration on the basis of a ratio of an amount of exposure in which an image of a line disappears to an amount of exposure in which an image of another line disappears.

A still further object of the present invention is to provide the aberration measurement method which allows a measurement by an optical microscope by determining an amount of an aberration by measuring a pitchwise width of a line-and-space pattern containing plural lines having different line widths.

Further, the present invention has a still further object to provide the aberration measurement method of an optical projection system, which does not require a preparation of plural pattern groups, each pattern group consisting of lines each having a line width different from each line of the other pattern group, by measuring an amount of an aberration on the basis of information in respect of a shape of an image of a wedge-shaped pattern.

A still further object of the present invention is to provide the aberration measurement method of an optical projection system, which can improve a degree of precision of measurement, by measuring an aberration while predicting an amount of exposure in which to cause the images of lines to disappear, in association with a variation in lengths of the lines.

Furthermore, the present invention has another object to provide the aberration measurement method of an optical projection system, which can be applied to an aberration measurement method for measuring an amount of an aberration at a high speed and with a high degree of precision by an observation method such as, for example, FIA, LSA, LIA or the like, when no electronic microscope is used.

Still further, the present invention has another object to provide the aberration measurement method of an optical projection system, which can measure the aberration by measuring an amount of a deviation of a position of an image of a line-and-space pattern or an isolated line pattern, each formed on a substrate.

Furthermore, the present invention has another object to provide the aberration measurement method of an optical projection system, which corrects a deviation of a position of an image to be measured for determining the aberration.

Moreover, the present invention has another object to provide the aberration measurement method of an optical projection system, which can accurately measure an enlarged deviation of the positions between the images by taking advantage of a Moire mark, without using a microscope with a complicated construction, by forming first and second groups of line-and-space pattern images as a zigzag pattern.

In addition, the present invention has another object to provide the aberration measurement method of an optical projection system, which can measure an amount of a deviation of positions between the first and second line-and-space pattern images by correcting the deviation with a Moire mark formed by third and fourth line-and-space pattern images.

The other objects and the constructions to achieve the objects according to the present invention will become apparent in the course of the description which follows.

In order to achieve the objects of the present invention, there is provided a method for the measurement of an amount of an aberration of an optical projection system, which comprises the step of locating a mask in an optical path of the optical projection system, the mask being formed with a line-and-space pattern containing lines each having an equal line width; the step of locating a substrate coated with a photoresist in a projection position of the optical projection system; the step of exposing the line-and-space pattern to the photoresist coated on the substrate at a predetermined amount of exposure by projecting with the optical projection system; the step of developing the substrate exposed; and the step of determining an amount of an aberration on the basis of a difference between line widths of the lines of the pattern on the both end sides in the pitch direction of the line-and-space pattern images, in the images of the line-and-space patters, by the photoresist coated on the substrate by the developing step.

This construction of the present invention allows a measurement of the amount of the aberration on the basis of the line widths of the patterns so that the measurement can be effected with an optical microscope.

Further, the present invention provides the aberration measurement method for measuring the amount of the aberration of the optical projection system, which comprises the step of locating a mask in an optical path of the optical projection system, the mask being formed with a line-and-space pattern containing lines, each line having an equal line width; the step of locating a substrate coated with a photoresist in a projection position of the optical projection system; the step of exposing the line-and-space pattern to the photoresist coated on the substrate by varying an amount of exposure and a position of exposure, while projecting the line-and-space pattern with the optical projection system; the step of developing the substrate exposed; and the step of determining an amount of an aberration on the basis of a ratio of a first amount of exposure to a second amount of exposure, the first amount of exposure being an exposure amount in which an image of a one line of the lines on both pitchwise ends of the line-and-space pattern disappears and the second amount of exposure being an exposure amount in which an image of an other line of the lines on both pitchwise ends of the line-and-space pattern disappears, in the line-and-space pattern images by the photoresist in the position of exposure formed on the substrate by the developing step.

With the arrangement in this aspect of the present invention, the amount of the aberration can be determined on the basis of the ratio of the amounts of exposure in which to cause the images of the lines of the pattern to disappear so that the measurement can be effected with an optical microscope.

Furthermore, the present invention provides the aberration measurement method for measuring an amount of an aberration of the optical projection system, which comprises the step of locating a mask in an optical path of the optical projection system, the mask being formed with plural groups of line-and-space patterns, each line-and-space pattern group containing plural lines with each line having a different line width from each other; the step of locating a substrate coated with a photoresist in a projection position of the optical projection system; the step of exposing the patterns to the photoresist coated on the substrate at a predetermined amount of exposure by projecting with the optical projection system; the step of developing the substrate exposed; and the step of determining an amount of an aberration by measuring a pitchwise width of an image of each line-and-space pattern group by the photoresist formed on the substrate by the developing step.

Moreover, the plural lines having different line widths may be lines which are disposed on the both end sides in the pitchwise direction of the line-and-space pattern having the lines with equal line widths.

With the arrangement of the lines of the line-and-space patterns as described hereinabove, the measurement can be effected with an optical microscope because the amount of the aberration can be determined by measuring the width in the pitchwise direction of the line-and-space pattern containing the plural lines having different line widths.

Still further, the present invention provides the aberration measurement method for measuring the amount of the aberration of the optical projection system, which comprises the step of locating a mask in an optical path, the mask being formed with a line-and-space pattern containing lines each having an equal line width and with a wedge-shaped pattern disposed on each of both pitchwise end sides of the line-and-space pattern, the wedge-shaped pattern being so formed as for its line width to vary gradually in a lengthwise direction of the line; the step of locating a substrate coated with a photoresist in a projection position of the optical projection system; the step of exposing the patterns to the photoresist coated on the substrate at a predetermined amount of exposure while projecting the patterns with the optical projection system; the step of developing the substrate exposed; and the step of determining an amount of an aberration on the basis of information in respect of a shape of the wedge-shaped pattern in the image of the pattern by the photoresist formed on the substrate by the developing step.

In this aspect of the present invention, the information relating to the shape of the wedge-shaped pattern may be information on the position in the lengthwise direction of the line so as for the line widths of the lines of the wedge-shaped pattern to become equal to each other or information on lengths of the line thereof.

With this arrangement, the amount of the aberration can be determined on the basis of the information relating to the shape of the wedge-shaped pattern as described hereinabove so that it is not necessary to prepare plural groups of patterns consisting of lines having different line widths.

Still further, the present invention provides the aberration measurement method for measuring the amount of the aberration of the optical projection system, which comprises the step of locating a mask in an optical path of the optical projection system, the mask being formed with a line-and-space pattern containing lines each having an equal line width and with a wedge-shaped pattern disposed on each of both pitchwise end sides of the line-and-space pattern, the wedge-shaped pattern being so formed as for its line width to vary gradually in a lengthwise direction of the line; the step of locating a substrate formed with a photoresist thereon in a projection position of the optical projection system; the step of exposing the pattern to the photoresist of the substrate by varying an amount and a position of exposure by projecting the pattern with the optical projection system; the step of developing the substrate exposed; and the step of determining an amount of an aberration on the basis of a ratio of a first amount of exposure to a second amount of exposure, the first amount of exposure being an exposure amount in which an image of a one pattern of the wedge-shaped pattern disappears and the second amount of exposure being an exposure amount in which an image of an other pattern of the wedge-shaped pattern disappears, in the line-and-space pattern images by the photoresist in the position of exposure formed on the substrate by the developing step.

This arrangement of the present invention can improve precision in measuring the amount of the aberration because the measurement can be effected while predicting the exposure amounts in which to cause the line images to disappear, in association with a variation of the line lengths.

In this arrangement, the wedge-shaped pattern may be preferably disposed so as to sustain a constant line width in a predetermined length in the lengthwise direction of the line and to allow the line width as a whole to vary in a stepwise manner. This arrangement makes it easier to read a variation in line widths of the image because the line width is sustained constant in the predetermined length.

In another aspect of the present invention, there is provided a mask for an optical projection system having plural groups of line-and-space patterns disposed such that a line having a different line width is located on its both pitchwise sides of a line-and-space pattern containing a line having an equal line width.

Further, the mask for the optical projection system may have a line-and-space pattern containing a line having an equal line width and a wedge-shaped pattern disposed on its both pitchwise end sides of the line-and-space pattern and formed so as for its line width to vary gradually in a lengthwise direction of the line.

The mask having the features as described hereinabove can be applied to the aberration measurement method according to the present invention for measuring the amount of the aberration of the optical projection system at a high speed and with a high degree of precision with an optical observation system, such as FIA, LSA or LIA, without using an electronic microscope.

In a further aspect of the present invention, there is provided an aberration measurement method for measuring an amount of an aberration of an optical projection system, which comprises the step of locating a mask in an optical path of the optical projection system, the mask being formed with a pattern containing either of a line-and-space pattern (L/S) or an isolated line pattern; the step of locating a substrate coated with a photoresist in a projection position of the optical projection system; the step of exposing the pattern to the photoresist of the substrate by projecting with the optical projection system; the step of developing the substrate exposed; and the step of measuring an amount of a deviation of a position of an image of the line-and-space pattern or an image of the isolated line pattern by the photoresist formed on the substrate by the developing step.

In this aspect, the present invention further provides an aberration measurement method for measuring an amount of an aberration of an optical projection system, which comprises the step of locating a mask in the optical path of the optical projection system, the mask being formed with a first pattern containing either of a line-and-space pattern or an isolated line pattern, each having a predetermined line width WA, and a second pattern containing either of a line-and-space pattern or an isolated line pattern, each having a predetermined line width WB different from the predetermined line width WA; the step of locating a substrate with a photoresist coated thereon at a projection position of the optical projection system; the step of exposing each of the first pattern and the second pattern formed on the mask to the photoresist of the substrate by projecting with the optical projection system; the step of developing the exposed substrate; and the step of measuring an amount of a deviation between a position of an image of a line of the first pattern and a position of an image of a line of the second pattern by the photoresist formed on the substrate by the developing step.

In this aspect, the mask may be formed with the line of the first pattern and the line of the second pattern disposed parallel to each other.

With the arrangement as described hereinabove, the aberration can be measured by measuring an amount of the deviation of the position of the image of the line-and-space pattern or the isolated line pattern formed on the substrate.

Furthermore, the present invention provides the aberration measurement method which comprises the step of locating a mask in an optical path of the optical projection system, the mask being formed with a first pattern containing either of a line-and-space pattern or an isolated line pattern, each line having a predetermined line width WA, a second pattern containing either of a line-and-space pattern or an isolated line pattern, each line having a predetermined line width WB different from the predetermined line width WA, and a third pattern containing either of a line-and-space pattern or an isolated line pattern, each line having the predetermined line width WB; the step of locating a substrate with a photoresist coated thereon at a projection position of the optical projection system; the step of exposing each of the first, second and third patterns formed on the mask to the photoresist of the substrate by projecting with the optical projection system; the step of developing the exposed substrate; and the step of measuring an amount of a deviation between a position of an image of a line of the first pattern and a position of an image of a line of the second or third pattern by the photoresist formed on the substrate by the developing step, by correcting the amount thereof on the basis of the positions of the line images of the second and third patterns.

The arrangement of this method can correct the deviation of the position of the image to be measured for the aberration on the basis of the second and third patterns.

In addition, the mask may be formed with the lines of the first, second and third patterns disposed so as to be parallel to each other.

Further, in this aspect, the present invention provides the aberration measurement method for measuring an amount of an aberration of the optical projection system, which comprises the step of locating a first mask in the optical path of the optical projection system, the first mask being formed with a first pattern containing either of a line-and-space pattern or an isolated line pattern, each line having a predetermined line width WA and a second pattern containing either of a line-and-space pattern or an isolated line pattern, each line having a predetermined line width; the step of locating a second mask in the optical path of the optical projection system, the second mask being formed with a third pattern containing either of a line-and-space pattern or an isolated line pattern, each line having a predetermined line width WC and a fourth pattern containing either of a line-and-space pattern or an isolated line pattern, each line having the predetermined line width WB; the step of locating a substrate with a photoresist coated thereon at a projection position of the optical projection system; the step of exposing each of the patterns on the first mask and the patterns on the second mask to the photoresist of the substrate by projection with the optical projection system; the step of developing the exposed substrate; and the step of measuring an amount of a deviation between a position of an image of a line of the first pattern and a position of an image of a line of the third pattern by the photoresist formed on the substrate by the developing step, by correcting the amount thereof on the basis of the position of an image of a line of the second pattern and the position of an image of a line of the fourth pattern.

With this arrangement, the line images of the second pattern and the firth pattern can be used for the correction of the amount of the deviation of the positions of the line images of the first pattern and the third pattern for measuring the aberration.

Moreover, in this aspect, each line of the first pattern may be disposed parallel to each line of the second pattern and each line of the third pattern may be disposed parallel to each line of the fourth pattern. Further, the exposure step to be effected by projection may contain a step for locating each mask so as to make each line of each pattern of each mask parallel to each other.

Still further, in this aspect, the present invention provides an aberration measurement method for measuring an amount of an aberration of an optical projection system, which comprises the step of locating a one mask with a first line-and-space pattern group in an optical path of the optical projection system, the first line-and-space pattern group having a first line-and-space pattern, a second line-and-space pattern and a third line-and-space pattern formed in a zigzag pattern, the first line-and-space pattern containing lines with each line having a predetermined line width WA disposed parallel to and linearly symmetrically to a first virtual center line intersecting with an optional virtual reference line LA0 at an angel $\alpha$ not larger than 45°, the second line-and-space pattern containing lines with each line having the predetermined line width WA disposed parallel to and linearly symmetrically to a second virtual center line intersecting at an angel $-\alpha$ at an intersection point YA on the virtual reference line LA0 apart in a predetermined distance LN1 from an intersection point XA between the virtual reference line LA0 and the first virtual center line, and the third line-and-space pattern containing lines with each line having the predetermined line width WA disposed parallel to and linearly symmetrically to a third virtual center line intersecting at an angel $\alpha$ at an intersection point ZA on the virtual reference line LA0 apart in the predetermined distance LN1 from the intersection point YA; the step of locating an other mask with with a second line-and-space pattern group in the optical path of the optical projection system, the second line-and-space pattern group having a fourth line-and-space pattern, a fifth line-and-space pattern and a sixth line-and-space pattern formed in a zigzag pattern, the fourth line-and-space pattern containing lines with each line having the predetermined line width WB disposed parallel to and linearly symmetrically to a fourth virtual center line intersecting with an optional virtual reference line LB0 at an angel $-\alpha$, the fifth line-and-space pattern containing lines with each line having the predetermined line width WB disposed parallel to and linearly symmetrically to a fifth virtual center line intersecting at an angel $\alpha$ at an intersection point YB on the virtual reference line LB0 apart in a predetermined distance LN2 from an intersection point XB between the virtual reference line LB0 and the fourth virtual center line, and the sixth line-and-space pattern containing lines with each line having the predetermined line width WB disposed parallel to and linearly symmetrically to a sixth virtual center line intersecting at an angel $-\alpha$ at an intersection point ZB on the virtual reference line LB0 apart in the predetermined distance LN2 from the intersection point YB; the step for exposing the first line-and-space pattern group on the one mask and the second line-and-space pattern group on the other mask in a superimposed manner to the photoresist by projection with the optical projection system; the step of developing the substrate exposed; and the step of measuring a deviation between a position of an image of a line of the first line-and-space pattern group and a position of an image of a line of the second line-and-space pattern group by the photoresist formed on the substrate by the developing step by utilizing a Moire mark.

This arrangement allows an accurate measurement of the deviation of the positions between the images on an enlarged scale by taking advantage of a such Moire mark without using a complicated operation with a microscope, because the first line-and-space pattern group and the second line-and-space pattern group are formed in a zigzag fashion.

Moreover, in this aspect of the present invention, there is provided the aberration measurement method which comprises the step of locating the one mask in the optical path of the optical projection system, the one mask being further formed with a third line-and-space pattern group in a position different from the position of the first line-and-space pattern group, the third line-and-space pattern group containing lines having a seventh line-and-space pattern, an eighth line-and-space pattern and a ninth line-and-space pattern formed each in a zigzag pattern, the seventh line-and-space pattern group containing lines having each line of the predetermined line width WC disposed parallel to and linearly symmetrically to a seventh virtual center line intersecting at an optional angel $\beta$ with a virtual reference line LC0 parallel to the virtual reference line LA0 and apart in a predetermined distance LN11, the eighth line-and-space pattern containing lines having each line of the predetermined line width WC disposed parallel to and linearly symmetrically to an eighth virtual center line intersecting at an angel $-\beta$ at an intersection point YC on the virtual reference line LC0 apart in a predetermined distance LN3 from an intersection point XC between the virtual reference line LC0 and the seventh virtual center line, and the ninth line-and-space pattern containing lines with each line having the predetermined line width WC disposed parallel to and linearly symmetrically to a ninth virtual center line intersecting at an angel $\beta$ at an intersection point ZC on the virtual reference line LC0 apart in the predetermined distance LN3 from the intersection point YC; and the step of locating the other mask in the optical path of the optical projection system, the other mask being further formed with a fourth line-and-space pattern group in a position different from a position of the second line-and-space pattern, the fourth line-and-space pattern group being disposed parallel to and linearly symmetrically to the third line-and-space pattern group so as for the virtual reference line LC0 to come into agreement with a virtual reference line LD0 disposed parallel to the virtual reference line LB0 and apart in a predetermined distance LN12 therefrom; wherein the step of measuring a deviation between the position of the image of the line of the first line-and-space pattern group and the position of the image of the line of the second line-and-space pattern group by utilizing the Moire mark further comprises the step of measuring the deviation by correction with a Moire mark of an image of the third line-and-space pattern group and an image of the fourth line-and-space pattern group.

With this arrangement, the deviation between the positions between the lines of the first line-and-space pattern image and the second line-and-space pattern image can be measured by correcting the deviation with a Moire mark formed by the third line-and-space pattern image and the fourth line-and-space pattern image.

In this case, the correction can be made easier when the distances LN11 and LN12 are set to become equal to each other.

In a still further aspect, the present invention provides a mask for an optical projection system having a first lineand-space pattern group formed thereon, the first line-and-space pattern group having a first line-and-space pattern, a second line-and-space pattern and a third line-and-space pattern formed in a zigzag pattern, the first line-and-space pattern containing lines having each line of the predetermined line width WA disposed parallel to and linearly symmetrically to the first virtual center line intersecting with the optional virtual reference line LA0 at the angel α not larger than 45°, the second line-and-space pattern containing lines having each line of the predetermined line width WA disposed parallel to and linearly symmetrically to the second virtual center line intersecting at the angel −α at the intersection point YA on the virtual reference line LA0 apart in the predetermined distance LN1 from the intersection point XA intersecting the virtual reference line LA0. with the first virtual center line, and the third line-and-space pattern containing lines having each line of the predetermined line width WA disposed parallel to and linearly symmetrically to the third virtual center line intersecting at the angel a at the intersection point ZA on the virtual reference line LA0 apart in the predetermined distance LN1 from the intersection point YA.

This arrangement of the mask can be applied in an appropriate fashion to the method for the measurement for the amount of the aberration of the optical projection system.

In a still further aspect of the present invention, there is provided a mask set for an optical projection system having the mask having the same construction as described hereinabove; and an other mask being formed with a second line-and-space pattern group having a fourth line-and-space pattern, a fifth line-and-space pattern and a sixth line-and-space pattern formed in a zigzag pattern, the fourth line-and-space pattern containing lines with each line of the predetermined line width WB disposed parallel to and linearly symmetrically to the fourth virtual center line intersecting with the optional virtual reference line LB0 at an angel −α not larger than 45°, the fifth line-and-space pattern containing lines with each line of the predetermined line width WB disposed parallel to and linearly symmetrically to the fifth virtual center line intersecting at the angel α at the intersection point YB on the virtual reference line LB0 apart in the predetermined distance LN2 from the intersection point XB between the virtual reference line LB0 and the fourth virtual center line, and the sixth line-and-space pattern containing lines with each line of the predetermined line width WB disposed parallel to and linearly symmetrically to the sixth virtual center line intersecting at the angel α at the intersection point ZB on the virtual reference line LB0 apart in the predetermined distance LN2 from the intersection point YB.

With this arrangement, the mask set according to the present invention can be employed appropriately for forming a superimposed image for use in the measurement of the aberration of the optical projection system in accordance with the present invention.

In this aspect, the present invention provides the mask set for use with the optical projection system, which comprises the one mask being further formed with the third line-and-space pattern group in the position different from the position of the first line-and-space pattern group, the third line-and-space pattern group containing the seventh line-and-space pattern, the eighth line-and-space pattern and the ninth line-and-space pattern formed in a zigzag pattern, the seventh line-and-space pattern group containing lines having each line of the predetermined line width WC disposed parallel to and linearly symmetrically to the seventh virtual center line intersecting at the optional angel β with the optional virtual reference line LC0 parallel to the virtual reference line LA0 and apart in the predetermined distance LN11 therefrom, the eighth line-and-space pattern containing lines having each line of the predetermined line width WC disposed parallel to and linearly symmetrically to the eighth virtual center line intersecting at the angel −β at the intersection point YC on the virtual reference line LC0 apart in the predetermined distance LN3 from the intersection point YC between the virtual reference line LC0 and the seventh virtual center line, and the ninth line-and-space pattern containing lines having each line of the predetermined line width WC disposed parallel to and linearly symmetrically to the ninth virtual center line intersecting at the angel β at the intersection point ZC on the virtual reference line LC0 apart in the predetermined distance LN3 from the intersection point YC.

In this arrangement of the mask according to the present invention, the third line-and-space pattern group may be used for correction upon measurement of the amount of the aberration of the optical projection system.

Further, this arrangement of the present invention may provide the mask set for use with the optical projection system in which the other mask is formed with the fourth line-and-space pattern group in a position different from the position of the second line-and-space pattern group in a manner that the fourth line-and-space pattern group disposed linearly symmetrically to the third line-and-space pattern group is formed so as for the virtual reference line LC0 to come substantially into agreement with the virtual reference line LC0 parallel to the virtual reference line LB0 and apart in the predetermined distance LN12 therefrom.

In this arrangement of the mask set according to the present invention, the third line-and-space pattern group may further be employed for correction upon measurement of the amount of the aberration of the optical projection system.

In a still further aspect, the present invention provides a method for measuring an aberration of an optical projection system, which comprises forming a measuring pattern image in a predetermined pitch by the optical projection system; and determining an amount of the aberration on the basis of a difference of widths of the patterns locating on both pitchwise end sides of the measuring pattern image.

In another further aspect, the present invention provides a method for measuring an aberration of an optical projection system, which comprises forming plural measuring pattern images by the optical projection system; and determining an amount of the aberration by comparing shapes of the measuring patterns locating on both end sides of the plural measuring pattern images.

In this aspect, the present invention further provides the aberration measurement method in which the plural measuring patterns are line-and-space patterns having lines of equal line widths; and the amount of the aberration may be measured on the basis of a variation in shapes of the patterns on both pitchwise end sides of the line-and-space patterns.

Furthermore, the present invention provides the aberration measurement method in which the plural measuring patterns are wedge-shaped patterns so as for each line width to vary gradually in a lengthwise direction of the pattern; and the amount of the aberration is measured on the basis of a variation in shapes of the wedge-shaped patterns.

In an additional aspect, the present invention provides an exposure apparatus, which comprises an optical projection system for forming plural measuring patterns by illumination with exposing light; and an operation unit for determining an amount of an aberration by comparing the measuring patterns on both end sides of the plural measuring pattern images.

In this aspect, the present invention provides the exposure apparatus which further comprises a control unit for transcribing the pattern onto the substrate by varying a light quantity of the exposing light and a position of exposure; wherein the operation unit determines the amount of the aberration on the basis of a ratio of an exposure amount in which an image of a one line of the patterns locating on the both pitchwise end sides of the patterns in each exposure position disappears to an exposure amount in which an image of the other line of the patterns locating thereon in each exposure position disappears.

BRIEF DESCRIPTION OF THE DRAWINGS

FIG. 2 is a view for describing a second embodiment of the present invention, which shows groups of line-and-space patterns with each line-and-space pattern formed so as for its line width each of the lines on both end sides to gradually vary.

FIG. 10 is a view showing an example of a comparison pattern for use in the working examples of the present invention.

FIG. 11 is a view showing an example of a comparison pattern for use with the vernier method in a fifth embodiment of the present invention.

FIG. 16 is a view showing a box pattern for use in a seventh embodiment of the present invention.

FIG. 19 is a graph showing a relationship of amounts of deviation of imaging positions with line widths of patterns or amounts of asymmetrical aberration.

DESCRIPTION OF THE PREFERRED EMBODIMENTS

First, a description will be made of the principle of the present invention and an apparatus suitable for use with the present invention, with reference to FIGS. 17 to 20.

Figure 13:
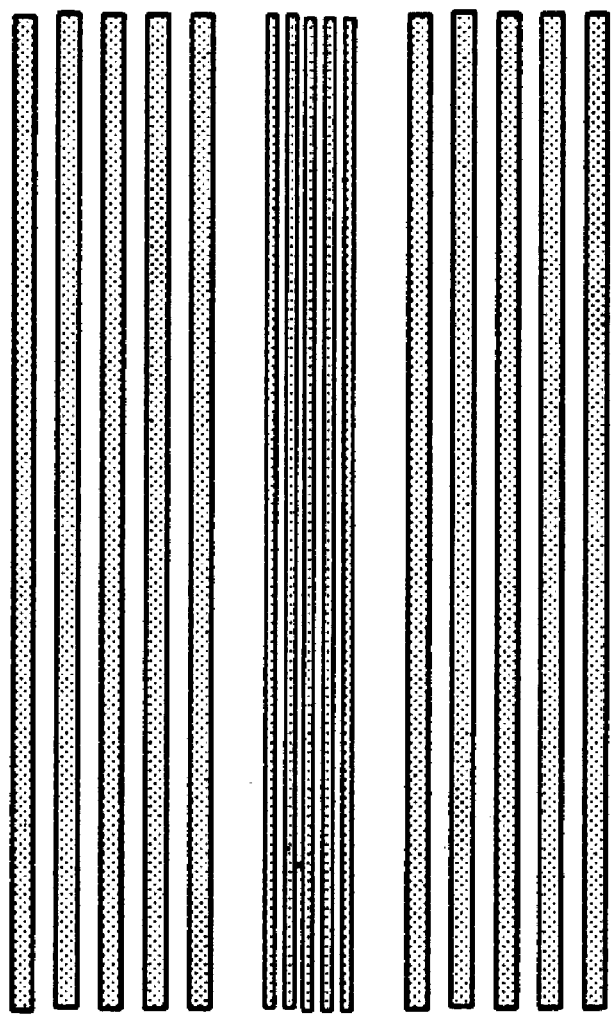
FIG. 13 is a view showing a variation of a pattern of FIG. 12.
Figure 17:
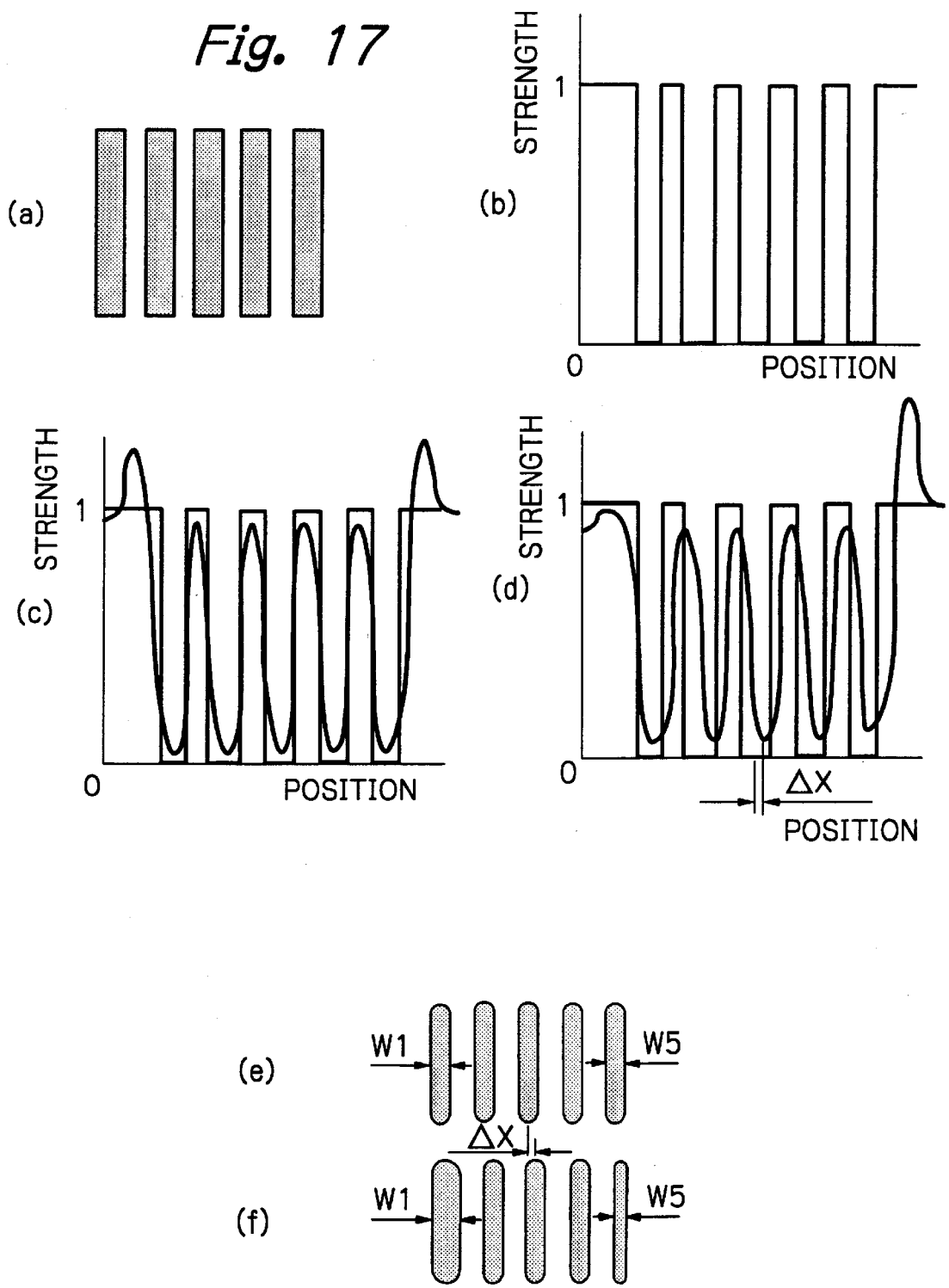
FIG. 17 is a view for describing a distribution of intensities of a pattern and a distribution of intensities of space images on a mask.

FIG. 17 shows an example of a pattern on a photomask and a distribution of intensities of space images of the pattern. FIG. 13($a$) is a plan view showing a dark line pattern (referred to as "a positive pattern") consisting of five lines each forming a light shade section made of a chromium wire having a certain line width, as a reticle (mask) pattern, on a light transmission section on a reticle made of a glass (quartz) substrate. It is to be noted herein that the reticle pattern may also include a line-and-space pattern that consists of a such positive pattern and a clear line pattern (referred to as "a negative pattern") forming the light transmission section on the glass substrate, which may consist of, for example, five lines each having a certain line width and may be formed by forming the light shade section with chromium or the like on the glass substrate and then removing the five lines each having a certain line width from the chromium light shade section to form the light shade section made of the glass.

Generally, the line-and-space pattern can be defined as a pattern consisting of a plurality of straight segments (lines) acting as a light shade section and spaces acting as a light transmission section, the straight lines each having a certain line width and being parallel to each other, and the spaces each having a certain width and being interposed therebetween so as to separate the light shade lines from each other. Further, usually, the line width of each line may be set to be equal to the width of the light transmission space interposed between the two light shade lines. The light shade section constitutes the positive pattern, and the negative pattern is a pattern in which the light shade section of the positive pattern is replaced with the light transmission section. The term "line-and-space pattern" means both of the positive pattern and the negative pattern.

FIG. 17($b$) is a graph showing a distribution of intensities of a light shade pattern on a photomask, each line having a line width of, for example, 1.75 $\mu$m. FIG. 17($c$) is a graph showing an ideal distribution of intensities of a space image, when this pattern is projected onto an object with a light flux having a wavelength of 365 nm (i-rays) through an exposure device having a numerical aperture (NA) of an projection lens of 0.60 and a coherency ($\sigma$ value) of an optical illumination system of 0.36. FIG. 17($b$) shows an example in which the actual distribution is superimposed on the ideal distribution. FIG. 17($c$) further shows the case where the aberration is zero.

If a projection lens would have a comatic aberration amount, for example, by x $\mu$m. the distribution of intensities of a space image may be indicated as in FIG. 17($d$), when superimposed on the graph of FIG. 17($b$). In this case, as shown in FIG. 17($d$), it is found that the position of the intensities of the space image, when projected on the object, is deviated by an amount ($\Delta$X) from the distribution of the intensities on the mask. It is further to be noted herein that FIG. 17 indicates figures for description, not figures showing actual cases of distributions of intensities of space images.

FIGS. 17($e$) and 17($f$) show examples of resist images formed by exposing space images of FIGS. 17($c$) and 17($d$), respectively, to a photosensitive substrate by projection.

When there is no comatic aberration as shown in FIG. 17(e), an image of each line is formed in a uniform width and position. On the other hand, if there is a comatic aberration as shown in FIG. 17(f), it is found that the positions of the images of the three central lines are deviated by the amount ($\Delta X$) from the case where there is no comatic aberration and that the line images on the both end sides differ in their widths therefrom, although the widths of the three central line images are substantially equal to each other. In other words, the present invention is so adapted as to measure the aberration by utilizing an amount of a variation or a difference of amounts of variations in the widths (W1, W5) on the both pitchwise end sides of the images of the line-and-space patterns transcribed on the substrate.

Figure 18:
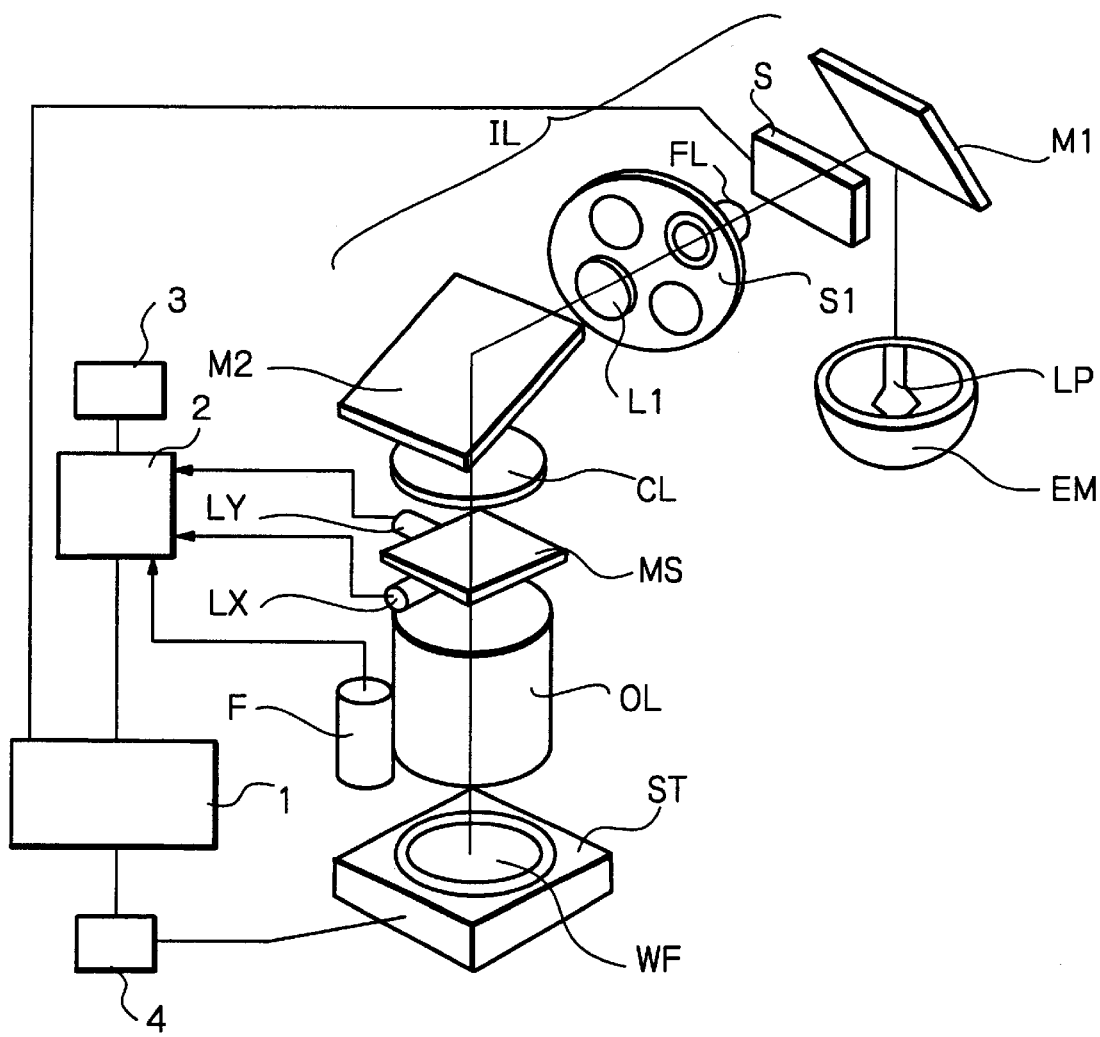
FIG. 18 is a schematic view of an apparatus suitable for the measurement in accordance with the present invention.

FIG. 18 is a schematic view showing the construction of an exposure apparatus so adapted as to carry out the aberration measurement method according to the present invention. In FIG. 18, a light flux for illumination from a light source LP is shaped into a predetermined light flux by an optical illumination system IL containing optical members, although not shown in detail, which in turn is irradiated on a mask MS.

On the optical axis, there are disposed the optical illumination system IL, the mask MS, a projection lens OL, and a stage ST with a wafer WF loaded thereon in this order.

The optical illumination system IL may comprise a mercury lamp LP, an oval mirror EM, a mirror M1, a fly-eye lens FL, a variable aperture diaphragm S1, a lens system L1, a mirror M2 and a condenser lens CL.

With the arrangement of the exposure apparatus as described hereinabove, light generated for exposure from the mercury lamp LP is condensed at the oval mirror EM, followed by sending to the mirror M1 with which in turn the light is reflected to a shutter S for controlling the amount of exposure of the exposing light. After the passage through the shutter S, the light is converted into a uniform illumination intensity at the fly-eye lens FL. The light having a such uniform illumination intensity is then sent to the mask MS through the lens system L1, the mirror M2 and the condenser lens CL. When the light is emitted from the mercury lamp LP at a constant intensity, a predetermined amount of exposure with the light can be obtained by controlling a time of opening the shutter S with a controller.

An illumination light (i-rays, etc.) from the mercury lamp LP is formed so as to have a distribution of nearly uniform intensities and the uniform illumination light is so arranged as to be irradiated on the mask having minute patterns. It can be noted herein that laser beams from EX(ArF) or the like may also be used in place of the mercury lamp.

The variable aperture diaphragm S1 is arranged so as to be variable in the numerical aperture of the illumination system IL and disposed nearby a Fourier transformation plane in the illumination system IL for the mask pattern (hereinafter referred to as "a pupil plane of the illumination system"), that is, an exit plane of the fly-eye lens FL, i.e. a focal plane on the mask side.

The light flux transmitted through the mask MS disposed so as to intersect with the light axis is allowed to project and expose an image of the pattern formed on the mask MS, through the projection lens OL, onto a resist on the surface of the wafer WF loaded on the stage ST so as to be movable in two directions, i.e. an X-direction and a Y-direction, on the plane intersecting with the light axis by a control circuit 4 for X-axially driving and Y-axially driving. The displacement of the stage ST in the X-direction and the Y-direction is measured by an interferometer, although not shown.

The stage ST may further be provided with a Z-stage and a $\theta$-stage. The Z-stage is so arranged as to move the wafer WF in a direction of the optical axis in a minute amount and the $\theta$-stage is so arranged as to rotate the wafer WF on a XY-plane at a minute angle. The movement of the Z-stage and the $\theta$-stage can be controlled by the control circuit 4.

An autofocus system, not shown, may also be provided so as to cause the surface of the wafer WF to come substantially into agreement with an imaging plane of the projection lens OL. Further, the autofocus system may be disposed so as to substantially conjugate the mask pattern with the wafer surface with respect to the projection lens OL.

Moreover, in order to detect the resist image formed on the wafer WF, there is provided an optical observation system F of an image processing type having an optical axis different from the light axis of the projection lens OL, such as an optical alignment system of a bright field imaging type, or an optical observation system LX, LY of a type with light passes through the projection lens OL, such as an optical alignment system of a dark field imaging type.

The optical observation system F or LX, LY is provided with an image pickup element for picking up the resist image of the pattern, and image pickup signals of the resist images obtained are then transmitted to an operation unit 2.

To the operation unit 2 is connected a memory 3 in which in turn is stored a relationship of the amounts of the deviation of the positions with respect to amounts of non-symmetrical aberrations of the patterns A and B, as shown in Fig. FIG. 14(b). The amount of the deviation of the position of the pattern A relative to the position of the pattern B can be given on the basis of the image pickup signals obtained by the pickup with the optical observation system F or LX, LY by exposing the patterns A and B. Further, the non-symmetrical aberration of the projection lens can be determined from the amount of the deviation of the relative positions of the patterns A and B. Such inspection and measurement may be effected at plural locations within the projection field, thereby displaying a vector map (not shown) with a display (not shown) or the like.

Further, the operation unit 2 is arranged to measure the pitchwise width and the lengthwise length of the resist image on the basis of the image pickup signals from the optical observation systems X and LX, LY. The memory 3 is stored with the relationship of a variation in the line width with the amount of the asymmetrical aberration or the ratio of the amounts of exposure.

The line width or the difference of the line widths of the resist images may be determined on the basis of the image pickup signals from the optical observation system F or LX, LY, and the amount of the asymmetrical aberration of the projection lens may be determined on the basis of the relative variation in the line widths of the resist images or the line length thereof when the amounts of exposure are varied. Such inspection and measurement may be carried out at plural locations within the projection field and a vector map, although not shown, may be displayed on a display screen (not shown) or by any other appropriate means.

The optical projection system as an object to be measured for its aberration may be an optical system of a reflection type or of a reflective diffraction type as well as an optical projection system of a diffraction type. Further, it is not necessary to share the construction of the exposure apparatus with a measuring device and a device for exclusive use with measurement can also be used.

A shape of a pattern for measurement may be a shape that may be measured with a general registration measurement device commercially available as well as the optical observation system F or LX, LY.

FIG. 19(a) shows an imaging position of a pattern on an object to which to be transcribed when a size of the pattern on the object is varied, when the projection lens is set so as to have an amount of a comatic aberration of, for example, 0.6 μm. It can be found from this figure that the imaging positons may vary with the size of the pattern to be transcribed on the object even if the amount of the comatic aberration is set to be identical to each other.

FIG. 19(b) shows the imaging positions of the object when the size of the pattern to be transcribed on the object is varied when the amount of the comatic aberration of the projection lens is changed, for example, to 0.35 μm (pattern A) and to 0.70 μm (pattern B). This view can be obtained by measuring the amounts of the deviation of the imaging positions for the known comatic aberrations (for example, 0.2 μm, 4.0 μm, 0.6 μm and 0.8 μm) and then plotting them. Although, for example, FIG. 19(a) shows the amount of the deviation of the imaging positions when the comatic aberration is set to 0.6 μm, it can be found from this figure that the amounts of the deviation of the imaging positions are 0.12 μm and 0.07 μm, when the line widths of the lines of the patterns are read as 0.35 μm and 0.7 μm, respectively. When the amounts of the deviation of the imaging positions are read from a view showing a relationship of amounts of the deviation of imaging positions with respect to sizes of line patterns for each amount of aberration in the manner as described hereinabove, a view as shown in FIG. 19(b) can be obtained.

As is apparent from these figures, it is found that the amounts of the deviation of the imaging positions of the patterns A and B become greater as the amount of the comatic aberration becomes greater. It is further found that a difference between the amounts of deviation of the imaging positions of the patterns A and B becomes greater. In other words, even if the absolute value of an amount of the deviation of the imaging position of each pattern could not be measured, an amount of a comatic aberration can be given by measuring a difference between the amounts of the deviation of the imaging positions of the patterns A and B by combining the pattern A with the pattern B.

The pattern A may be equal to the pattern B in line width. In this case, however, it is preferred that a phase shift pattern as described in Japanese Patent Publication No. 62-50,811 be provided with either of the patterns A and B.

The present invention is so adapted as to measure the aberration by taking advantage of an amount of the deviation of such imaging positions or a difference of the imaging positions caused by the features of lines (i.e. line width, an isolated line or plural lines).

Figure 5:
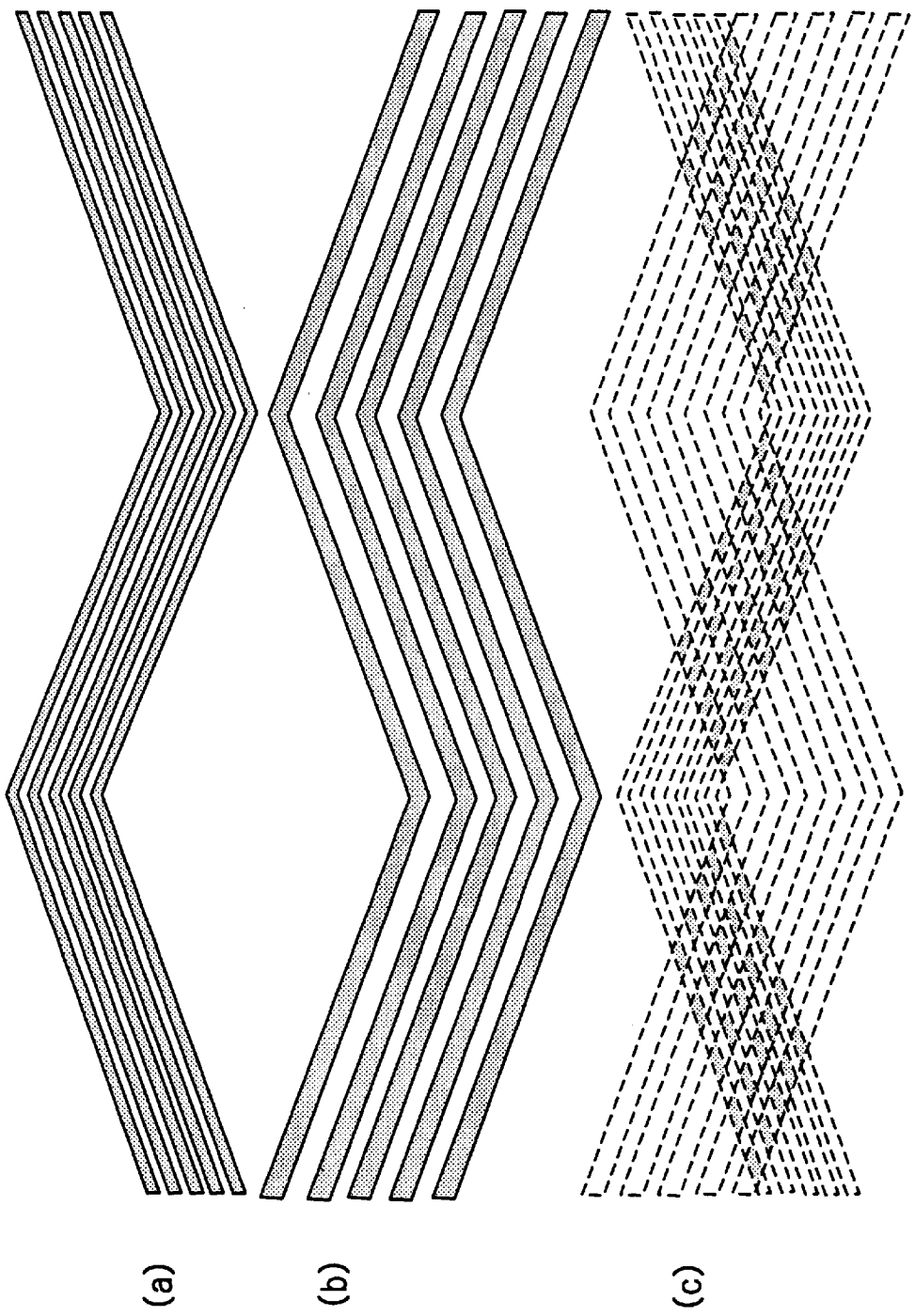
FIG. 5 is a view showing an example of a zigzag pattern and a Moire mark to be used in the working examples of the present invention.

FIG. 5 shows an example of a combination of patterns for use in the present invention to be formed on a mask, as will be described hereinafter. FIG. 5(a) shows a pattern corresponding to the pattern A and FIG. 5(b) shows a pattern corresponding to the pattern B. FIG. 5(c) shows an image obtained by exposing the pattern of FIG. 5(a) and the pattern of FIG. 5(b) superimposed on the photosensitive substrate and developing it. This is a so-called Moire mark and a difference of the deviation of the images of each pattern can be measured with high precision by utilizing the Moire mark, as will be described hereinafter more in detail.

Figure 20:
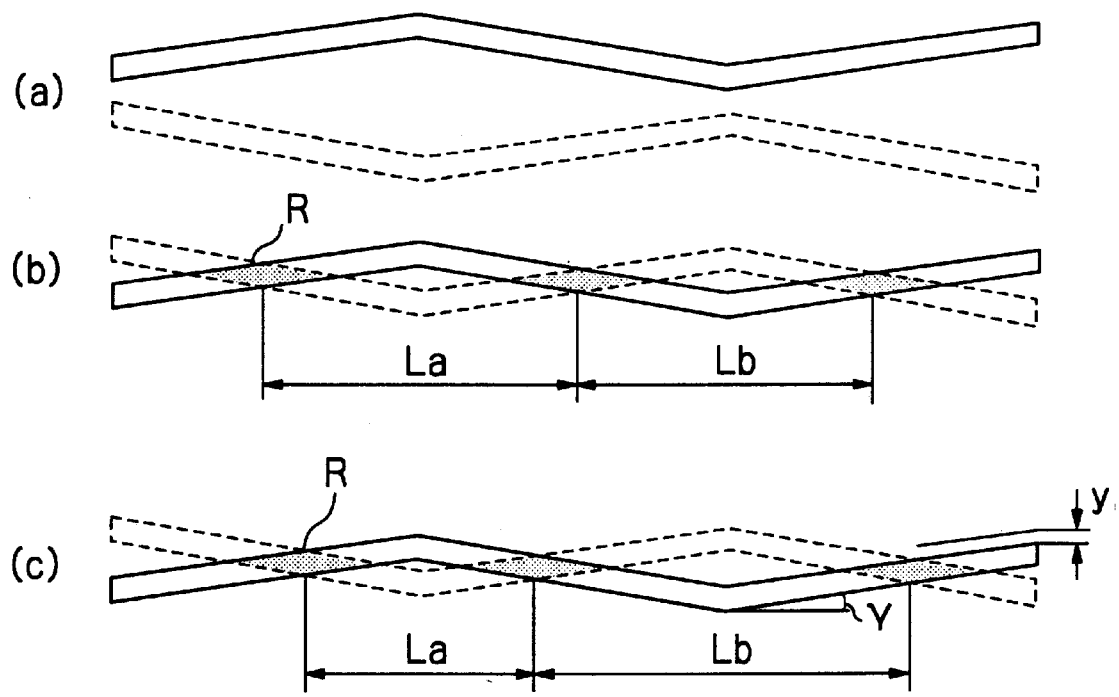
FIG. 20 is a view for describing the principle of Moire.

FIG. 20 is a view for explaining the principle of the Moire phenomenon. In FIG. 20(a), for brevity of description, a zigzag pattern indicated by the solid line and extending horizontally is referred to herein as "a main scale" and a zigzag pattern indicated by the broken line and extending linearly symmetrical to the main scale is referred to herein as "a secondary scale". Each of the pattern consists of three line segments, each segment having a predetermined line width and being inclined at an angle γ or −γ, smaller than 45°, with respect to the horizontal direction, with their ends connected to each other in series, thereby forming a one zigzag pattern. FIG. 20 shows a zigzag pattern so that this pattern is an isolated line pattern.

FIGS. 20(b) and 20(c) each show a resist image obtained by forming the main scale and the secondary scale on separate masks, superimposing them on a photosensitive substrate, and exposing them with the substrate by projection. As shown in these drawings, a light-shade resist portion formed by the patterns of the main scale and the secondary scale is left as a resist image as indicated by a rhombic shape R.

FIG. 20(b) shows a resist image formed in the case where the main scale and the secondary scale are superimposed on the substrate in an ideal manner without causing any deviation of their positions. On the other hand, FIG. 20(c) shows a resist image formed in the case where the image of the main scale is deviated slightly downward from the image of the secondary scale. In FIG. 20(b), it is found that a horizontal space La between a pair of the three rhombic images formed is equal to a horizontal space Lb between another pair of the three rhombic images formed. On the other hand, as shown in FIG. 20(c), even where the image of the main scale is deviated slightly from the image of the secondary scale, a difference between the horizontal distance La between a pair of the three rhombic images formed and the horizontal distance Lb between another pair of the three rhombic images formed may become greater. The difference between the distance La and the distance Lb may be enlarged greater with respect to the same amount of the deviation of the equal main scale as the angle γ or −γ of inclination of the zigzag segment with respect to the horizontal direction becomes smaller, in association with the line widths of the line segments, within the scope where the rhombic shape can be formed.

Further, it should be noted herein that, as the main scale has the same line width as the secondary scale in the case of FIG. 20, the amounts of the deviation to be caused by the aberration should be equal to each other and an image as shown in FIG. 20(b) should be formed when the main scale is aligned with the secondary scale with high precision upon projection. Therefore, a such deviation of the resist images as shown in FIG. 20(c) can be seen as it is as an error in alignment of the pattern of the main scale with the pattern of the secondary scale.

If the amount of the deviation of the main scale from the ideal position of the secondary scale as shown in FIG. 20(b) is set as y, as shown in FIG. 20(c), the relationship as represented by y=[(La-Lb)/4] tan γ can be established. Accordingly, the amount of the deviation as indicated by y can be given when the horizontal distances La and Lb between the rhombic-shaped images can be measured.

(First Embodiment)

Figure 1:
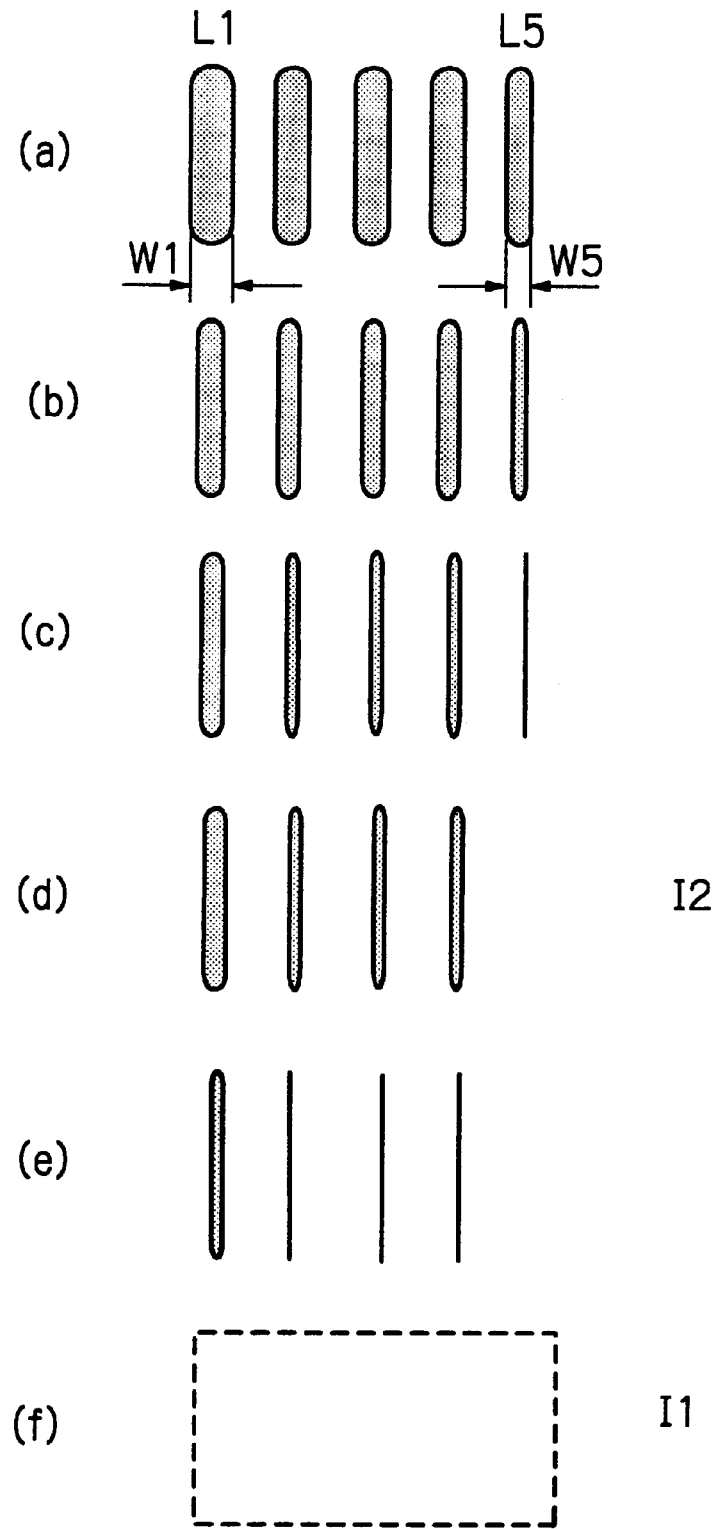
FIG. 1 is a view for describing a first embodiment of the present invention, which shows a state in which lines on both end sides of patterns are caused to disappear at varying amounts of exposure with exposing light.

A description will now be made of a first embodiment of the present invention with reference to FIG. 1. As described hereinabove with reference to FIG. 17, a pattern formed on a reticle or mask as shown in FIG. 17(a) is exposed to a photoresist coated on a substrate by projection with with an optical system having an aberration and, after the exposure has been finished, the substrate is then developed forming a resist image in accordance with an amount of exposure, thereby forming a resist image, as shown in FIG. 17(f), i.e. in FIG. 1(a). In this figure, a pattern of a line locating on the left end side is indicated by reference symbol L1, a pattern of a line locating on the right end side by reference symbol L5, a line width of an image of the pattern L1 by reference symbol W1, and a line width of an image of the pattern L2 by reference symbol W5.

It is to be noted herein that the resist images as shown in FIGS. 1(a) through 1(f) can be obtained by developing the photoresist coated on the substrate, to which the pattern has been exposed by varying positions of exposure while exposing in stepwise increasing amounts of exposure, not at a constant amount of exposure. More specifically, the resist images may vary in such a manner that the resist images as shown in FIG. 1(a) may be converted through those as shown in FIG. 1(b) to the resist images as shown in FIG. 1(c) by increasing the amounts of exposure, in which an image of the right end line L5 is in such a state as it is about to disappear, followed by the state as shown in FIG. 1(d) in which the right end line L5 has thoroughly disappeared. The amount of exposure at this time is indicated by I2. By further increasing the amounts of exposure, the resist images may vary from the state of FIG. 1(e) where the central lines are about to disappear to the state of FIG. 1(e) where all the lines has disappeared. The amount of exposure at this time is indicated by I1.

An amount of an asymmetrical aberration at this time can be given by incorporating a difference of the measured line widths (W1–W5) or a ratio of the measured amounts of exposure, i.e. I2/I1, respectively, into a previously determined relationship of the line widths of the left and right lines with a known amount of an asymmetrical aberration or a previously determined ratio of the amount of exposure to a known amount of the asymmetrical aberration. The relationship between the differences of the measured line widths (W1–W5) and the ratio of the measured amounts of exposure is memorized in the memory 3.

Alternatively, an amount of an asymmetrical aberration can be obtained immediately by input of the such difference or the such ratio in an operation unit (not shown) when the such relationship and ratio as described hereinabove have been previously stored in the operation unit of a measuring device as shown in FIG. 18.

(Second Embodiment)

FIGS. 2A and 2B are each a second embodiment of the present invention. In this embodiment, the asymmetrical aberration can be obtained by transcribing the pattern onto a substrate by exposing at a predetermined quantity of light and measuring a difference between the line widths of the plural lines of a line-and-space pattern that is formed on a mask with its plural lines disposed so as to have pitchwise line widths different from each other. The measurement of the line widths of the lines can be effected with an optical microscope.

As shown in FIGS. 2A, there are formed five sets (a) through (e) of line-and-space patterns each consisting of five dark lines. In each of the line-and-space patterns, three central lines with the two end lines excluded therefrom are set to have a line width equal to each other. In FIG. 2A, the set (a) indicates a pattern corresponding to a difference of an asymmetrical aberration of, for example, 0.4 $\mu$m, with a line width of the left end line set to be larger and a line width of the right end line set to be smaller than the line width of each central line. FIG. 2A(b) indicates a pattern corresponding to a difference of an asymmetrical aberration of, for example, 0.2 $\mu$m, with a line width of the left end line set to be slightly larger and a line width of the right end line set to be slightly smaller than the line width of each central line. FIG. 2A(c) indicates a pattern corresponding to a difference of an asymmetrical aberration of 0 $\mu$m, that is, the pattern consisting of the five lines with all the lines set to have the equal line widths. On the other hand, FIG. 2A(d) indicates a pattern having the relationship opposite and symmetrical to the pattern as shown in FIG. 2A(b), that is, the pattern corresponding to a difference of an asymmetrical aberration of, for example, –0.2 $\mu$m, with a line width of the right end line set to be slightly smaller and a line width of the left end line set to be slightly larger than the line width of each central line. Likewise, FIG. 2A(e) indicates a pattern having the relationship opposite to the pattern as shown in FIG. 2A(a), that is, the pattern corresponding to a difference of an asymmetrical aberration of, for example, –0.4 $\mu$m, with a line width of the right end line set to be slightly smaller and a line width of the left end line set to be slightly larger than the line width of each central line.

FIG. 2B shows each a state of the resist images of the respective sets obtained by transcribing each set of the line-and-space patterns onto the mask by exposing with an optical projection system at a predetermined quantity of light, i.e. in increasing amounts of exposure than usual. As shown in FIG. 2B, the resist images of the pattern set (a) corresponding to the difference of the asymmetrical aberration of 0.4 $\mu$m is shown in such a manner that the right end line having the smaller line width was caused to disappear. Likewise, for the resist images of the pattern set (b) corresponding to the difference of the asymmetrical aberration of 0.2 $\mu$m, the right end line having the smaller line width disappeared. Further, for the resist images of the pattern set (e) corresponding to the difference of the asymmetrical aberration of –0.4 $\mu$m, the left end line having the smaller line width was caused to disappear. On the other hand, the resist images of the pattern sets (c) and (d) corresponding to the differences of the asymmetrical aberrations of 0 $\mu$m and –0.2 $\mu$m, respectively, have all their lines remained without disappearing, although the line widths have varied. In other words, four of the lines can be measured for the pattern sets (a), (b) and (e), while all of the five lines can be measured for the pattern sets (c) and (d). Therefore, from the pattern sets (c) and (d) where all the five lines can be measured, it can be found that a difference of an asymmetrical aberration of the optical projection system is approximately –0.1 $\mu$m corresponding to the difference between the patterns (c) and (d).

As is apparent from the above description, an image of a pattern to be used for practicing the present invention is so minute that it is very difficult to determine a line width of each line of the pattern with an optical microscope. It is possible, however, to measure a width of the line-and-space pattern as a whole with a such optical microscope. Therefore, in this embodiment, the width of the line-and-space pattern as a whole is measured by causing a line having a smaller line width to disappear by exposing at an appropriate exposure amount.

(Third Embodiment)

Figure 3:
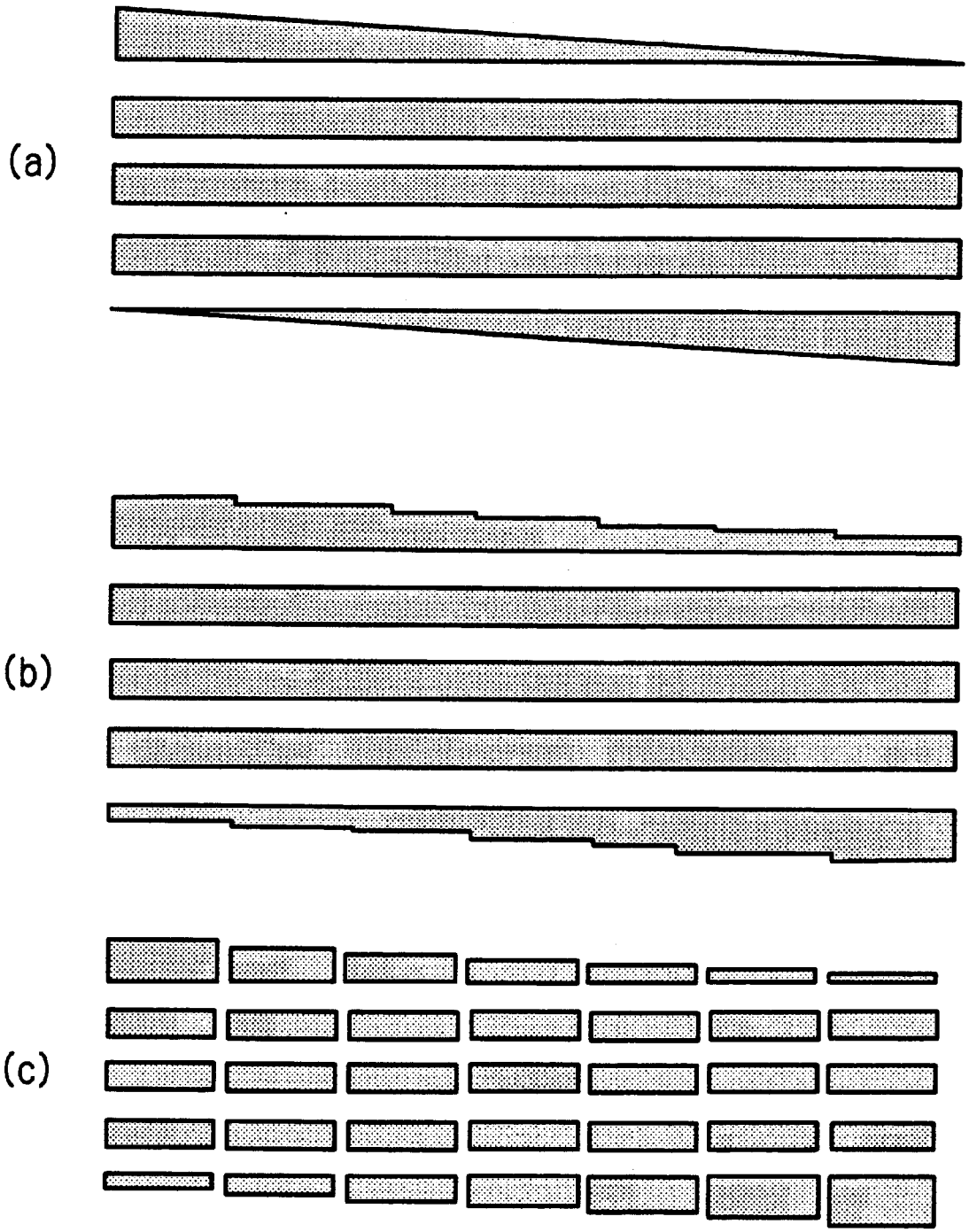
FIG. 3 is a view for describing a third embodiment of the present invention, which shows a line-and-space pattern with wedge-shaped lines disposed on both end sides thereof.

Then, a description will be made of a third embodiment of the present invention with reference to FIG. 3 showing three different kinds of patterns to be used for the third embodiment.

FIG. 3(a) shows an example of a line-and-space pattern consisting of three dark lines, each having a line width equal to each other, with a wedge-shaped line pattern disposed on each of the both sides in the pitchwise direction of the pattern. The wedge-shaped patterns are so disposed as for the line widths of the lines on their wider ends to be substantially the same as the line widths of the three central lines on their one ends and for the line widths of the lines on its narrower ends, opposite to the wider ends, to vary or narrow continually yet gradually in the lengthwise direction of the line to become nearly zero at their edge portions. Further, the wedge-shaped pattern disposed on the upper side has the same shape as that disposed on the bottom side and they are disposed linearly symmetrically to each other in opposite directions, i.e. for example, the wedge-shaped pattern on the top side is disposed so as for the portion having a smaller line width to be directed to the right, while the wedge-shaped pattern on the bottom side is disposed so as for the portion having the smaller line width to be directed to the left. Further, one side of each of the wedge-shaped patterns is disposed in a lengthwise direction and parallel to each of the three dark lines constituting the central lines.

FIG. 3(b) shows an example of a variation in a pattern from the pattern as shown in FIG. 3(a). The pattern differs from the pattern of FIG. 3(a) in that the wedge-shaped pattern is so formed as for its line width to vary stepwise, not continually as shown in FIG. 3(a). In this example, the width of the wedge-shaped patterns on the wider ends are set so as to amount to approximately two thirds of the widths of the three dark lines and the width of the wedge-shaped patterns on the narrower ends are set so as to amount to approximately a half of the widths of the three dark lines. Further, in this example, each of the wedge-shaped patterns may have its line width varied at seven steps and the lengths of the line segments between the adjacent steps are set to be substantially equal to each other. Moreover, a ratio of the wider line width of the wedge-shaped pattern to the narrower line width thereof is set to be approximately ½ although it may be set to be, for example, 1/7, when the wedge-shaped pattern is divided by seven steps into the line with seven line segments having different line widths.

FIG. 3(c) shows an example of a variation from the pattern as shown in FIG. 3(b). The pattern of FIG. 3(c) has a narrowly open space disposed at each step portion of the pattern of FIG. 3(b). The open space is disposed so as to separate a line segment of the line of the pattern from the adjacent line segment thereof and it can act as a light shade portion.

When the pattern as shown in FIG. 3 is exposed while projecting with an optical projection system by adjusting the amount of exposure so as to cause some of the narrower steps having narrower line widths to disappear, an asymmetrical aberration of the optical projection system can be obtained by determining the lengthwise positions of the stepped lines of the wedge-shaped pattern having the equal line widths on the both end sides of the resist images by measuring the pitchwise line widths of the pattern or by measuring the lengthwise lengths of both of the wedge-shaped patterns.

Alternatively, a ratio of the light quantity I2 at which to cause one of the wedge-shaped lines to disappear to the light quantify I1 at which to cause the other to disappear can be obtained by exposing the pattern by varying the amounts of exposure and the positions of exposure, measuring the lengthwise lengths of the both wedge-shaped lines of the resulting resist images thereof and then plotting. From this ratio, the asymmetrical aberration can be determined in substantially the same manner as described hereinabove with reference to the first embodiment of the present invention. Moreover, in this case, the length of the wedge-shaped line is plotted at each light quantity so that the light quantity at which the wedge-shaped line disappears can be predicted, thereby allowing a further accurate determination of the asymmetrical aberration of the optical projection system.

As is apparent from the description as made above, the pattern image to be used for the present invention has a line width so minute that it may sometimes become difficult for an optical microscope to measure such minute line widths and determine whether the such line widths are equal to each other. In this embodiment, however, the line segments having such small line widths can be allowed to disappear by applying appropriate amounts of exposure, so that it may become easy to find the positions in which the line widths at both ends are equal to each other. Further, although generally it is easier to find a line having the same lengthwise line length as another line, this embodiment can make it easier to find the lines having the equal lengths.

Figure 4:
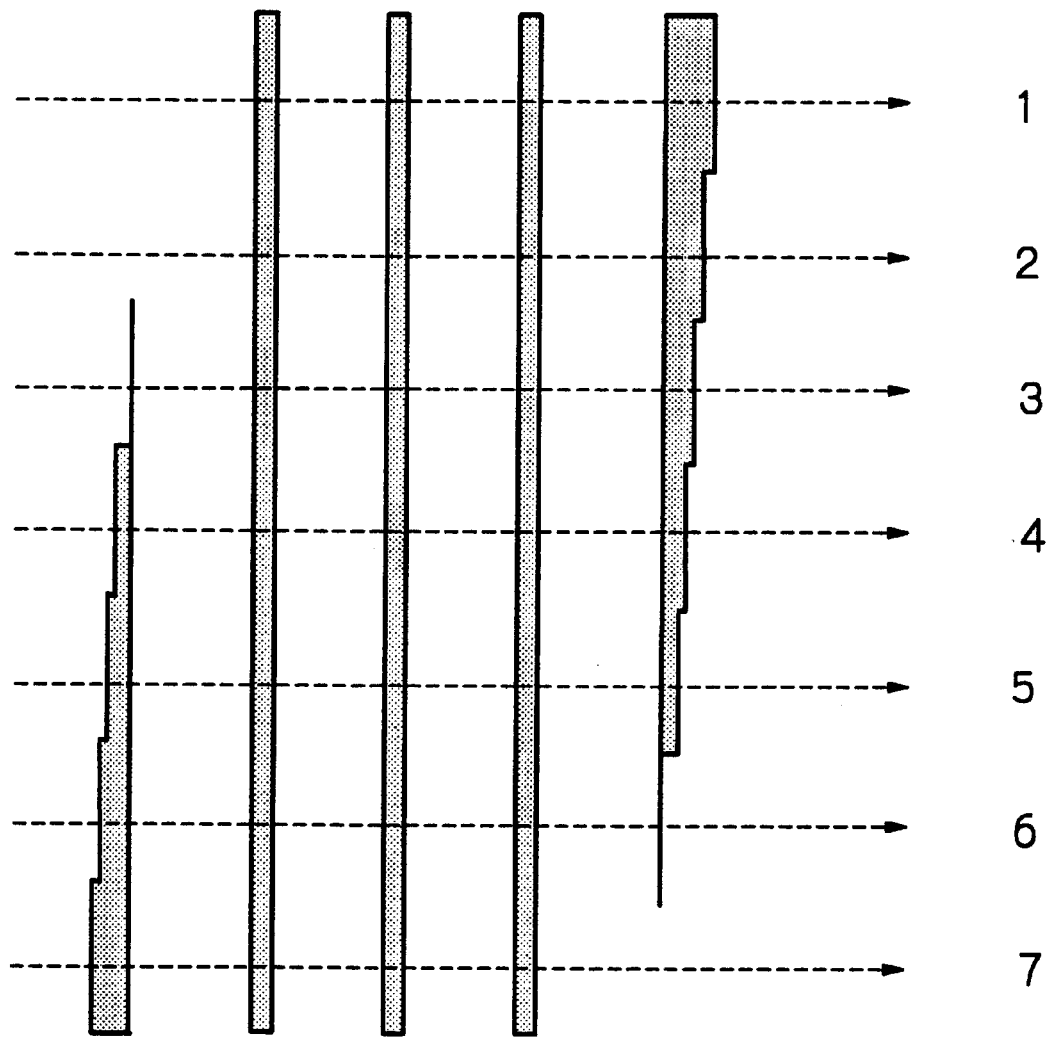
FIG. 4 is a view showing a resist image of the pattern in the third embodiment.

FIG. 4 shows an example of resist images obtained by using the pattern of FIG. 3(b). In this figure, reference broken lines are drawn intersecting with the lines of the pattern at each step portion of the wedge-shaped lines. The reference lines are indicated as reference lines 1 through 7, inclusive. In this example, it is shown that the wedge-shaped line on the right end side is greater in size as a whole and the wedge-shaped line on the left end side is smaller in size and further that, when the pattern has been exposed in the amount of exposure as in this embodiment, the two stepped line-and-space patterns having smaller line widths than the remaining line-and-space patterns have disappeared from the wedge-shaped line on the left end side, while the one line-and-space pattern having the smallest line width has disappeared from the wedge-shaped line on the right end side. In other words, an asymmetrical aberration can be found to be present between the step portions as indicated by the reference lines 3 and 6 and to be an aberration corresponding to the position of about 4.5. This is the case where the aberration is determined by the length of the line in its lengthwise direction.

On the other hand, when the width of the line-and-space pattern containing the wedge-shaped lines in its pitch direction is measured, it is found that the widths at the portions of the lines corresponding to the reference lines 1, 2 and 7 are substantially equal to the widths of the four lines and that the widths at the portions thereof corresponding to the reference lines 3, 4, 5 and 6 are substantially equal to those of the five lines. From these findings, it can be found that, like in the above case, there is an aberration corresponding to the position between the reference lines 4 and 5, i.e. the position of about 4.5.

It can be noted herein that the patterns as shown in FIGS. 3(a) and (c) can be used in substantially the same manner as the pattern as shown in FIG. 3(b). It should be noted herein, however, that the pattern of FIG. 3(c) can offer the advantage that the image of each step can be clearly observed in a separate manner from the images of the other steps because there is a light shade gap between each pair of the adjacent steps. Further, the pattern of FIG. 3(c) can be regarded as a pattern in which the line-and-space pattern of FIG. 2 is arranged in a lengthwise direction of the line although the line-and-space pattern of FIG. 2 is arranged in the pitch direction.

It is also noted herein that the wedge-shaped lines are not necessarily disposed in the inverted directions as shown in FIG. 3 in order to measure the widths and lengths of the wedge-shaped lines. In this case, it is possible to measure the lengthwise positions in which the line-and-space pattern varies its line width or lengths of the wedge-shaped lines and then average the values measured. However, the disposition of the wedge-shaped lines in the inverted directions, as shown in FIG. 3, can offer the advantage that it is easier to determine an asymmetrical aberration because the middle position between the positions, in which the line widths become equal to each other or between the lengthwise lengths in which they become equal to each other, can provide the asymmetrical aberration without any further processing.

Moreover, in this embodiment, the amount of exposure may be varied in various ways. The amount of exposure may be varied, for example, by adjusting a duration of exposure while setting a light intensity at a constant level, by adjusting a light intensity while exposing for a constant period of time or by adjusting the entire amount of exposure on the basis of an integrated value obtained by varying a light intensity and a duration of exposure.

Furthermore, the above embodiments are described in each case by taking as an example a line-and-space pattern consisting of five lines. It can be noted herein, however, that the number of lines of a line-and-space pattern to be used for the present invention may be two or more, preferably three or more, and more preferably five or more. In addition, although the above embodiments of the present invention are described by taking a positive pattern as an example, it should be noted that the description made hereinabove can also be applied to a negative pattern as it is unless otherwise set forth specifically in this description.

(Fourth Embodiment) A description will now turn to a fourth embodiment of the present invention.

Figure 7:
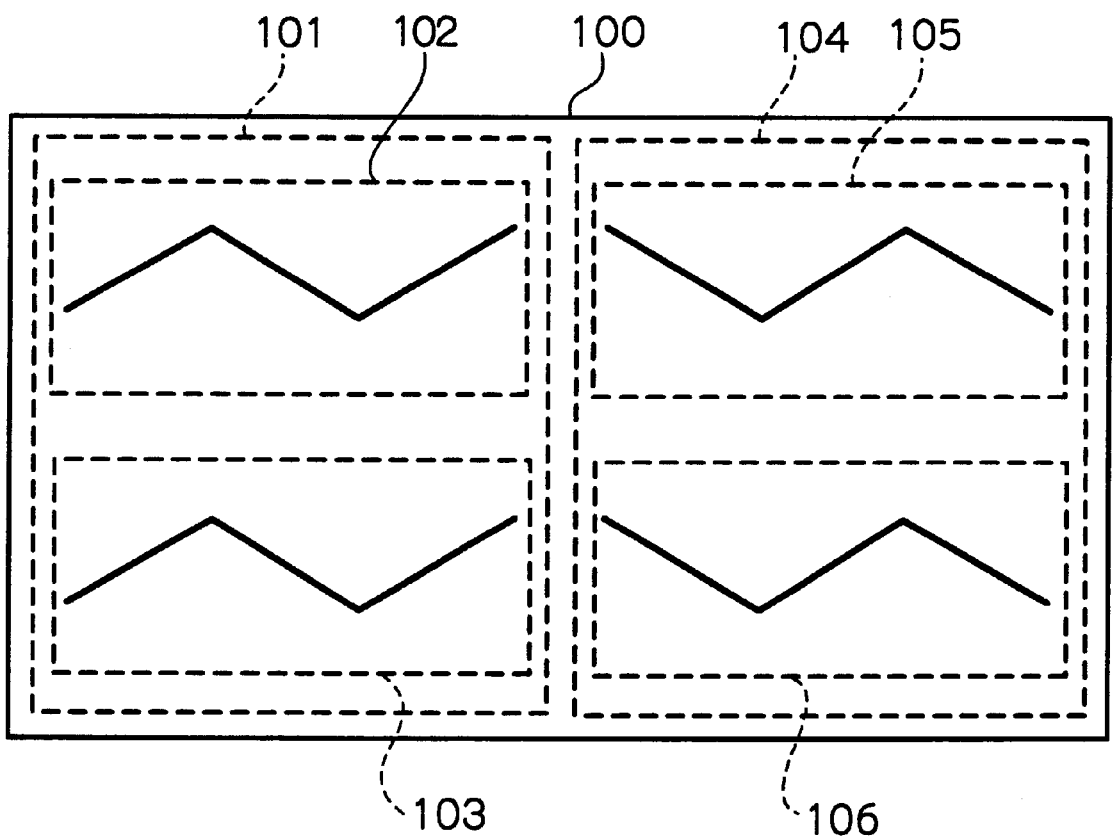
FIG. 7 is a schematic view showing a mask formed with a comparison pattern and a reference pattern for use in the working examples of the present invention.

FIG. 7 is a generalized view showing a mask containing a reference pattern to be used for correcting a deviation of the position of an image of the pattern. Although FIG. 7 shows the case in which a Moire mark is utilized, the case is not restricted to this example and there may also be the case where a vernier is used as will be described hereinafter.

FIG. 7 shows an example in which a mask 100 is formed with two mark groups 101 and 104. The mark group 101 has a reference pattern 102 formed on the upper half portion thereof and a comparison pattern 103 formed on the lower half portion thereof in a row. Likewise, the other mark group 104 has a reference pattern 105 formed on the upper half portion thereof and a comparison pattern 106 formed on the lower half portion thereof in a row.

The mask 100 with the mark groups 101 and 104 formed thereon is located in the optical projection system and exposed to a photosensitive substrate located on a stage by projecting the mark groups 101 and 104 with the optical projection system so as to allow the mark groups 101 and 104 to be superimposed on each other. By developing the photosensitive substrate exposed, the portion where the mark groups 101 and 104 have been superimposed are left as resist images on the substrate. An amount of a deviation between the reference patterns and the comparison patterns can be given by measuring the resist images thereof.

A description has been made herein of the example where two mark groups 101 and 104 are formed on one sheet of the mask 100. It can also be noted herein that each of the two mark groups 101 and 104 may be formed on each sheet of a mask. In this case, the mark groups 101 and 104 are superimposed on each other and exposed in a superimposed manner to one sheet of the photosensitive substrate by projection by locating the two masks alternately in the optical projection system for measuring the aberration of the patterns and projecting each of the mark groups 101 and 104 onto the one sheet of the substrate disposed on the stage. Thereafter, the resist images of the mark groups 101 and 104 are measured in the same manner as in the example where one sheet of the mask 100 is used, thereby enabling a correction of an amount of the deviation caused to occur upon superimposition and then determining an accurate amount of the deviation of the positions of the mark groups 101 and 104 by subtracting the amount of the deviation between the reference patterns from the amount of the deviation between the comparison patterns, as described with reference to FIG. 20 or FIG. 18.

Figure 8:
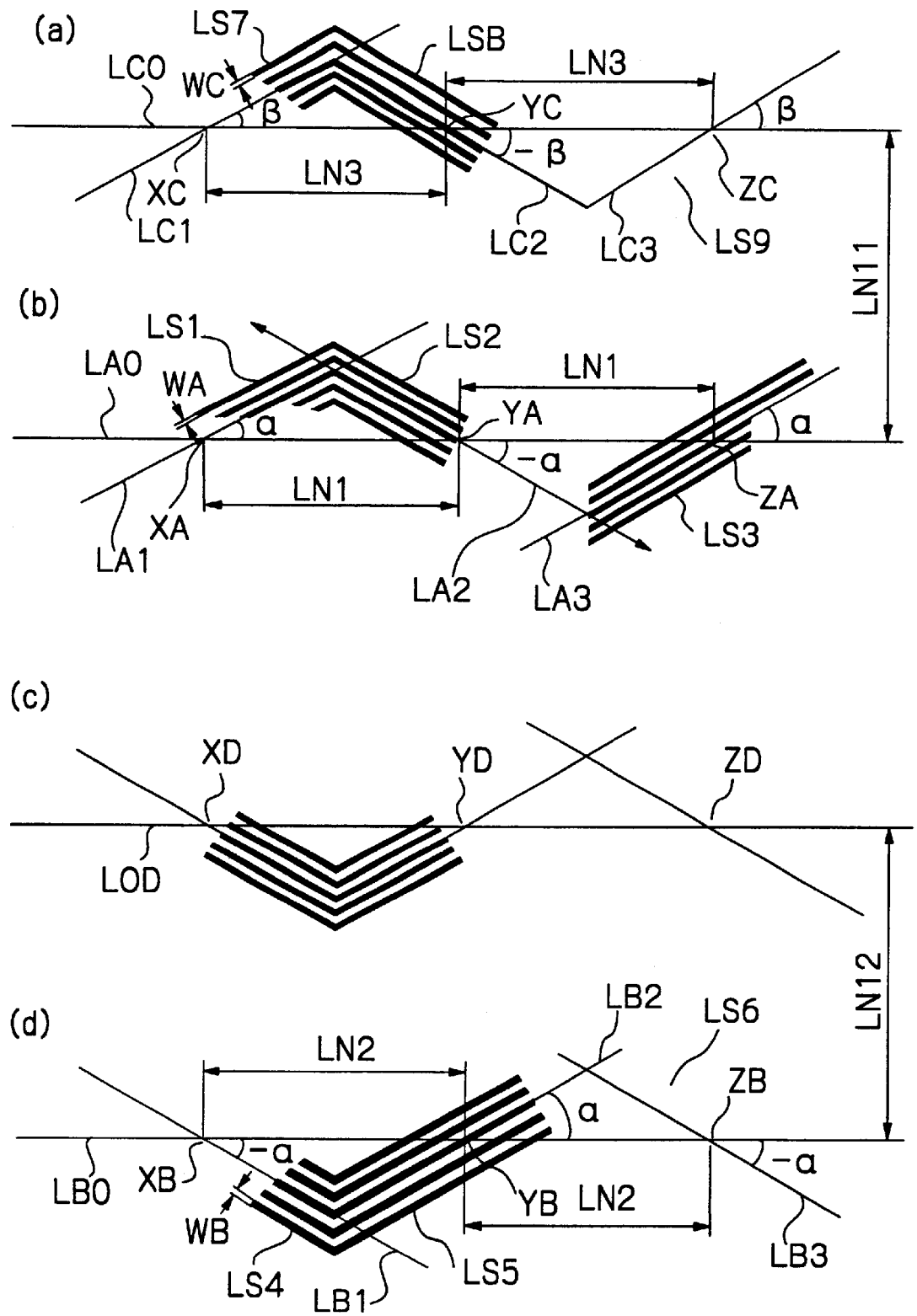
FIG. 8 is a view for a detailed description of a zigzag pattern in a fourth embodiment of the present invention.

FIG. 8 is a view showing patterns of FIG. 7 to be formed on the mask 100 in accordance with the first embodiment of the present invention. In FIG. 8, (a) and (c) indicate each a reference pattern, while (b) and (d) indicate each a comparison pattern.

First, as shown in FIG. 8(b), there is formed a first line-and-space pattern LS1 consisting of five lines, each having a line width WA, so as for the center axis of a center line thereof to coincide with a first virtual center line LA1 intersecting at an angle a smaller than 45°, e.g. at 30° in this example, with a virtual reference line LA0 extending horizontally. In this figure, a lower left corner portion of the line-and-space pattern LS1 is omitted for brevity of illustration. In the figures which follow, line-and-space patterns are likewise omitted partially or in a whole with its virtual center line only illustrated therein.

Then, a second line-and-space pattern LS2 consisting of five lines, each having the line width WA, is so formed as for the center axis of the center line thereof to coincide with a second virtual center line LA2 intersecting at an angle −α smaller than −45° at an intersection point YA locating on the virtual reference line LA0 apart in a predetermined distance LN1 from an intersection point XA between the virtual reference line LA0 and the first virtual center line LA1.

The distance LN1 is disposed so as for an intersection portion between the lowermost line of the first line-and-space pattern LS1 and the lowermost line of the second line-and-space pattern LS2 to be located over the virtual reference line LA0. Likewise, distances LN2 and LN3 referred to hereinafter are disposed so as for each intersection portion between the lines of two line-and-space patterns to be located on the half side of virtual reference lines LB0, LC0 and LD0.

Likewise, a third line-and-space pattern LS3 consisting of five lines, each having the line width WA, is so formed as for the center axis of the center line thereof to coincide with a third virtual center line LA3 intersecting at the angle α at an intersection point ZA locating on a virtual reference line A apart in the predetermined distance LN1 from the intersection point YA on the side opposite to the intersection point XA.

The first, second and third line-and-space patterns LS1, LS2 and LS3 formed in the manner as described hereinabove form a zigzag pattern that in turn is heretofore referred to as "a first line-and-space pattern group". This line-and-space pattern corresponds to the comparison pattern 103 in the mark group 101 of FIG. 7.

Then, FIG. 8(d) shows a second line-and-space pattern group corresponding to the comparison pattern 106 in the mark group 104 of FIG. 7, like the first line-and-space pattern group as described hereinabove. The second line-and-space pattern group is different from the first line-and-space pattern group in that the line width of each line of the second line-and-space pattern group is WB, while the line width of each line of the first line-and-space pattern group is WA. Likewise, the second line-and-space pattern group differs from the first line-and-space pattern group in that that the virtual reference line LB0 of the former corresponds to the virtual reference line LA0 of the latter, a fourth virtual center line LB1 to the first virtual center line LA1, a fourth line-and-space pattern LS4 consisting of lines each having the line width WB to the first line-and-space pattern LS1 consisting of the five lines each having the line width WA, a fifth line-and-space pattern LS5 to the second line-andspace pattern LS2, a sixth line-and-space pattern LS6 to the third line-and-space pattern LS3, an intersection point XB to the intersection point XA, an intersection point YB to the intersection point YA, an intersection point ZB to the intersection point ZA; and a distance LN2 to the distance LN1.

Moreover, the second line-and-space pattern group has the virtual center lines LB1, LB2 and LB3 intersecting with the reference line LB0 at angles −α, a and −α, respectively. Further, it is preferred that the distance LN2 be set to be equal to the distance LN1.

The above description is made of the line-and-space pattern which corresponds to the patterns 103 and 106 of FIG. and which may act as an object for comparison of the amounts of the deviation of the images. A description will now turn to a reference pattern.

As a reference line-and-space pattern, the third line-and-space pattern group is formed on the mask in a position different from the position of the first line-and-space pattern group within the one mark group. The third line-and-space pattern group consists of line-and-space patterns LS7, LS8 and LS9 and is formed in substantially the same as the first line-and-space pattern group with the exception that each line of the third line-and-space pattern group has a line width C, a virtual reference line LC0 corresponds to the virtual reference line LA0, a seventh virtual center line LC1 to the first virtual center line LA1, a seventh line-and-space pattern LS7 to the first line-and-space pattern LS1, an eighth line-and-space pattern LS8 to the second line-and-space pattern LS2, a ninth line-and-space pattern LS9 to the third line-and-space pattern LS3, an intersection point XC to the intersection point XA, an intersection point YC to the intersection point YA, an intersection point ZC to the intersection point ZA; and a distance LN3 to the distance LN1.

The third line-and-space pattern group may be of a shape entirely equal to that of the first line-and-space pattern group or the second line-and-space pattern group.

Then, a description will be made of a fourth line-and-space pattern which acts as a reference pattern within the other mark group.

The fourth line-and-space pattern group may be formed first by forming a virtual reference line LD0 in a position apart in a distance LN12 from the virtual reference line LB0 so as to be parallel to the virtual reference line LB0 and, then, by forming a group of line-and-space patterns linearly symmetrically to the third line-and-space pattern and the virtual reference line LC0 so as for the virtual reference line LC0 to coincide with the virtual reference line LD0.

It can be noted herein that, although the angles a and β at which the virtual center line intersects with the virtual reference line are indicated as positive angles in FIG. 8, they may be indicated as negative angles and that, although it is preferred to set the distance LN12 to be equal to the distance LN11, the former may be different from the latter. Further, when the distance LN12 is different from the distance LN11, the difference of the deviation of the images of the patterns may be corrected by a difference between the distances LN11 and LN12.

The mark group 101 may be formed by forming the first line-and-space pattern group as the pattern 103 of FIG. 7 and the third line-and-space pattern group as the pattern 102 thereof. Likewise, the mark group 104 may be formed by forming the second line-and-space pattern group as the pattern 106 of FIG. 7 and the fourth line-and-space pattern group as the pattern 105 thereof.

The patterns so formed on the mask are superimposed on each other in the manner as described hereinabove and exposed to the photosensitive substrate with a photoresist coating formed therewith by projection with an optical projection system for which is to be measured in a manner as will be described hereinafter.

A description will now be made of the method for preparing the mask on which the patterns are to be formed.

The one mark group and other mark groups are formed in such a manner that the distance LN11 becomes equal to the distance LN12 and that the virtual reference line LC0 extends parallel to the virtual reference line LD0 or the virtual reference lines LC0 and LD0 are located on the identical line.

Where the virtual reference line LC0 of the reference pattern of the one mark group ideally coincides with the virtual reference line LD0 of the reference pattern of the other mark group and the intersection point YC of the one mark group coincides with the point YD of the other mark group when the one and other mark groups are exposed by projection in a superimposed way, the difference between the amounts of the deviation of the images of the patterns of FIG. 8(b) and 8(c), i.e. the patterns to be compared with each other, becomes the difference between the amounts of the deviation of the line widths of the lines.

On the other hand, if the virtual reference line LC0 of the reference pattern would be exposed in the position deviating from the virtual reference line LD0 thereof, the Moire mark of these reference patterns deviates in a manner as shown in FIG. 20(c). From this deviation, the amount of the deviation of the masks can be determined. Therefore, the difference of the amounts of the deviation based on the difference of the line widths can be given by correcting the amount of the deviation between FIGS. 8(b) and 8(d).

In the case where the reference pattern comprises a line-and-space pattern consisting of plural lines such as, for example, five dark lines, the measurement can be effected with high precision by observing images of three of the centrally located lines with the outermost two lines excluded therefrom.

If the distance LN11 is different from the distance LN12, the correction may be further effected by the difference portion only.

Further, the virtual reference lines LA0 and LC0 may be situated on the identical straight line and the virtual reference lines LB0 and LD0 may be situated on the identical straight line. In this case, as shown in FIG. 3, the reference pattern 102 is located side by side with the comparison pattern 103 and the reference pattern 105 is located side by side with the comparison pattern 106. This can offer the advantage that this arrangement cab make the distance LN11 can be made equal to the distance LN12 at zero.

Figure 9:
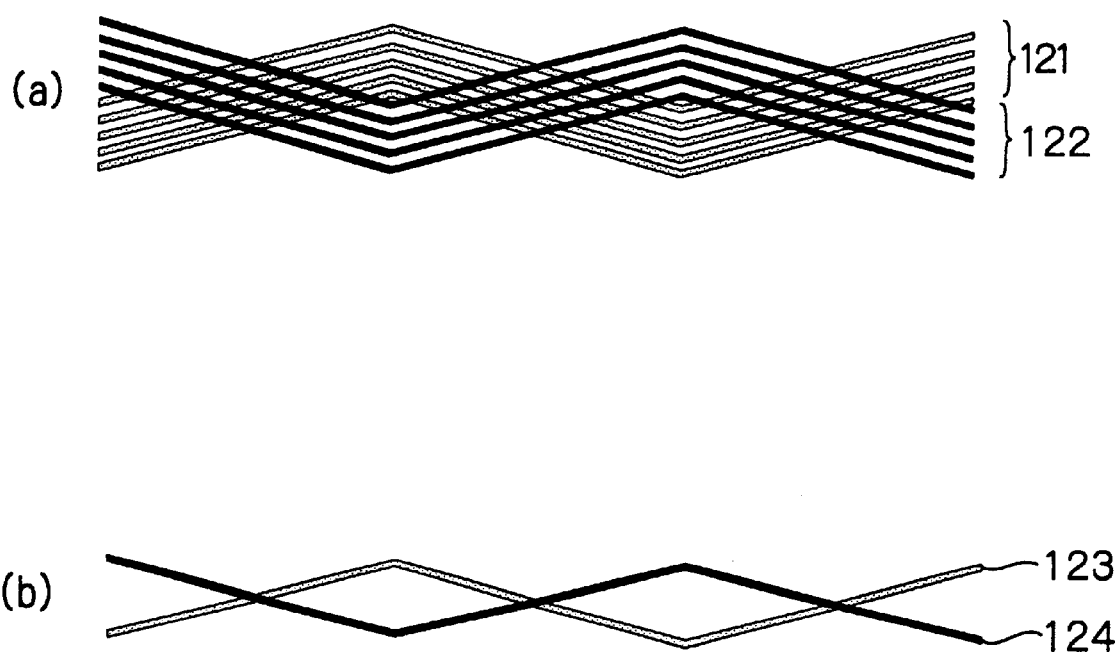
FIG. 9 is a view showing an example of a reference pattern for use in the working examples of the present invention.

FIGS. 9 to 11 show each an example of a pattern appropriate for a reference pattern or a comparison pattern as described with reference to FIG. 7.

FIG. 9 shows an example of a combination of patterns each consisting of lines each line having an equal line width. FIG. 9(a) shows an example in which a zigzag line-and-space pattern 121 acting as a main scale, each line having the equal line width, is superimposed on a zigzag line-and-space pattern 122, each line having an equal line width, which acts as a secondary scale and which is located linearly symmetrically thereto. This is the same as FIGS. 8(a) and 8(c) described with reference to FIG. 8.

FIG. 9(b) shows an example of a combination of a zigzag isolated line pattern 123 of the main scale, each line having an equal line width, with isolated lines 124 of the secondary scale formed in the same manner and located linearly symmetrically thereto. This corresponds each to the center lines extending above the virtual center lines of FIGS. 8(a)

and 8(*c*). It can be noted herein that the patterns as shown in FIGS. 9(*a*) and 9(*b*) have each line formed having the line width equal to each other so that they can be utilized as the reference patterns 102 and 105 of FIG. 7, respectively.

FIG. 10 shows an example of a combination of patterns each consisting of lines with their lines having line widths different from each other. FIG. 10(*a*) shows an example in which a zigzag line-and-space pattern 125 of the main scale, each line having a greater line width, is superimposed on a line-and-space pattern 126 of the secondary scale located linearly symmetrically thereto, each line having a narrower line width. This corresponds to the examples shown in FIGS. 8(*b*) and 8(*d*), although the relationship of the line widths is inverted from the examples shown in FIG. 10(*a*).

On the other hand, FIG. 10(*b*) shows an example in which a line-and-space pattern 127, each line having the equal line width, is superimposed on a line-and-space zigzag pattern 128 of isolated lines of the secondary scale located linearly symmetrically to the center line thereof. This corresponds to the line extending, for example, along the virtual center line extracted from the five lines of FIGS. 8(*a*) and 8(*b*).

Further, FIG. 10(*c*) shows an example in which a zigzag pattern 129 of isolated lines of the main scale, each line having a wider line width, and isolated lines 130 of the secondary scale each having a narrower line width, formed in the same manner and located linearly symmetrically thereto. This corresponds to the center line extending along the virtual center line of FIGS. 8(*b*) and 8(*d*), although the relationship of the line widths is inverted from the examples of FIG. 10(*c*).

As described hereinabove, FIGS. 10(*a*), (*b*) and (*c*) show each a combination of patterns each consisting of lines having different line widths or a combination of isolated lines with line-and-space patterns. Therefore, they can be used for measuring the aberration because they differ in the amounts of the deviation of the resist images with respect to the aberration.

(Fifth Embodiment)

Now, a description will be made of a fifth embodiment of the present invention.

FIG. 11 is directed to a fifth embodiment of the present invention, which shows a pattern for use in the vernier method. The pattern comprises, for example, a main scale 151 consisting of five small lines and a secondary scale 152 consisting of five large lines. In this figure, each small line of the main scale is indicated in an exaggerated way so as to become as large in size as one fifth of the total size of four out of the five large lines of the secondary scale, for ready reference for illustration. Actually, as a matter of course, the difference between the line width of each line of the main scale and that of each line of the secondary scale is slight. For example, the main scale consists of a line-and-space pattern of 0.7 $\mu$m and the secondary scale consists of a line-and-space pattern of 0.72 $\mu$m. As the difference between of the line widths of the lines consisting of the main and secondary scales is set smaller, the precision of measurement can be made higher although the reading of the difference therebetween should be effected with higher accuracy.

Then, the pattern of the main scale is superimposed on the pattern of the secondary scale so as for their lines to be parallel to each other, thereby forming a vernier 153 of the resist images of the patterns. From this vernier, the deviation of the image of the pattern of the main scale from the image of the pattern of the secondary scale can be found by determining the position of the largest resist line of the vernier in substantially the same manner as in usual vernier method. FIG. 11 shows the case in which no deviation is found and the largest line is situated in the central position.

As is seen in FIG. 11, the resist images of the lines on the both end sides of the line-and-space patterns become varying in size. Therefore, when a line-and-space pattern is formed consisting of, for example, 50 lines as central lines, a deviation between the lines having the same line widths (line sizes) can be determined by observing the resist images of the 30 to 40 lines situated at the central location.

The main and secondary scales as described hereinabove can also be utilized as a reference pattern. In the case where the main scale comprises a line-and-space pattern with each line having a line width of 0.7 $\mu$m and the secondary scale comprises a line-and-space pattern with each line having 0.72 $\mu$m, the difference of the deviation of the resist images of the line-and-space patterns is almost zero, as shown in FIG. 19. Therefore, the deviation of the positions of the lines, which can be seen by the vernier method, can correspond to the deviation of the set positions of the patterns of the main and secondary scales. From this finding, a such reference pattern can be used for correction.

Further, substantially the same effects can be achieved by providing a phase shifter for one of the main scale and the secondary scale each consisting of lines, each having substantially equal line width and by superimposing a pattern having a different line width. More specifically, in the case where there are used the main scale with each line having a line width of 0.7 $\mu$m and the secondary scale with each line having a line width of 0.72 $\mu$m is provided with the phase shifter, a space image causes a great deviation of positions of patterns as if the line-and-space pattern having the line width of 0.7 $\mu$m and a line-and-space pattern having a line width of 0.31 $\mu$m are superimposed on either one of them. On the other hand, a resist image can be formed as a combined image of the main scale and the secondary scale consisting of the lines, each having the line width different from each other, so that the deviation of the positions of the resist images can be determined by the vernier method.

Furthermore, it is also possible to use the main scale pattern 151 and the secondary scale pattern 152 with either one provided with the phase shifter, as patterns 103 and 106 of FIG. 7, respectively, and to use the patterns as shown in FIGS. FIG. 9(*a*) and 9(*b*) as the reference patterns 102 and 105, respectively, which in turn are set so as for their reference lines to become parallel to the lines of the main and secondary scales.

(Sixth Embodiment)

FIGS. 12 to 16 show examples of comparison patterns that require no reference pattern.

Figure 12:
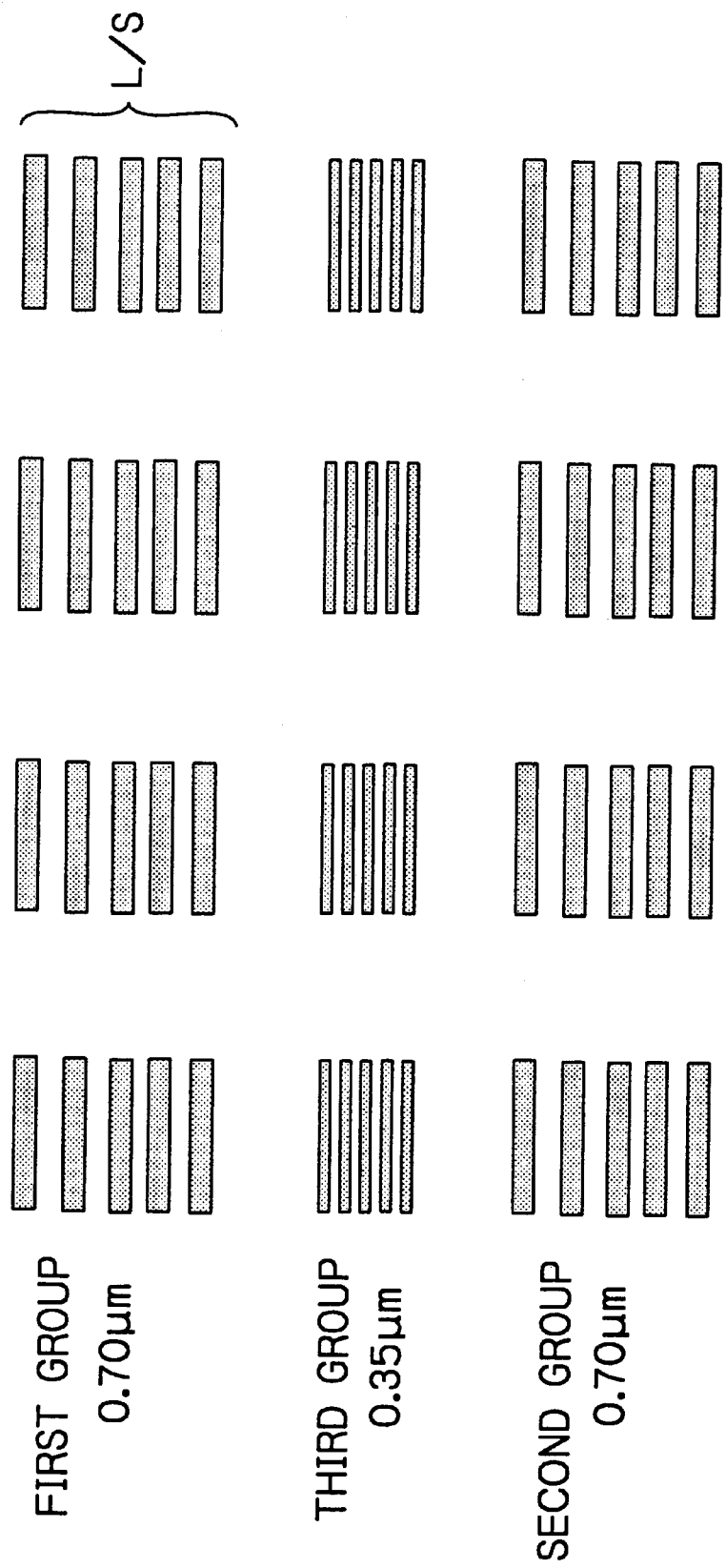
FIG. 12 is a view showing a pattern for use with an LSA mark in a sixth embodiment of the present invention.

FIG. 12 is directed to a sixth embodiment of the present invention, which indicates a line-and-space pattern formed on a mask. The line-and-space pattern may comprise a first, second and third groups of line-and-space patterns.

The first group of the line-and-space pattern may further comprise four line blocks situated extending in a lengthwise direction of the pattern, each line block consisting of five dark line segments each having a predetermined length and a line width of 0.70 m. The second group of the line-and-space pattern has the same pattern structure as the first group of the line-and-space pattern as described hereinabove and is located in a pitch direction and in a position apart in an appropriate distance. Further, the third group of the line-and-space pattern is formed so as to comprise four line blocks situated extending in a lengthwise direction of the pattern, each line block consisting of five dark line segments each having the same predetermined length as each w line segment of the first and second groups thereof and having a line width of 0.35 μm, which in turn is located in a position interposed equally apart between the first and second groups of the line-and-space patterns and parallel thereto. Each group of the line-and-space pattern is referred to herein as "an LSA (Laser Step Alignment) mark". This is one of alignment sensors installed in a stepper, i.e. a reduced projection exposure apparatus, as an optical alignment system of a dark field imaging type. The LSA (AMS) mark is usually a square pattern each side having a length of 4 μm.

By using a combination of such LSA marks in an appropriate manner, for example, a combination of the first group with the third group or the second group with the third group, the measurement of a space of the resist images between the two groups can give a difference of an amount of movement of the image of a line of one of the line-and-space pattern relative to the image of the corresponding line of the other. In this case, the difference of the relative movement can be determined simply by measuring the space between the first group and the third group or between the second group and the third group simply by combining the groups of the patterns. A more accurate value can be determined by measuring both groups and averaging the measured values. The measurement of the position of the LSA mark may be effected in a manner as will be described with reference to FIGS. 14 and 15.

Figure 14:
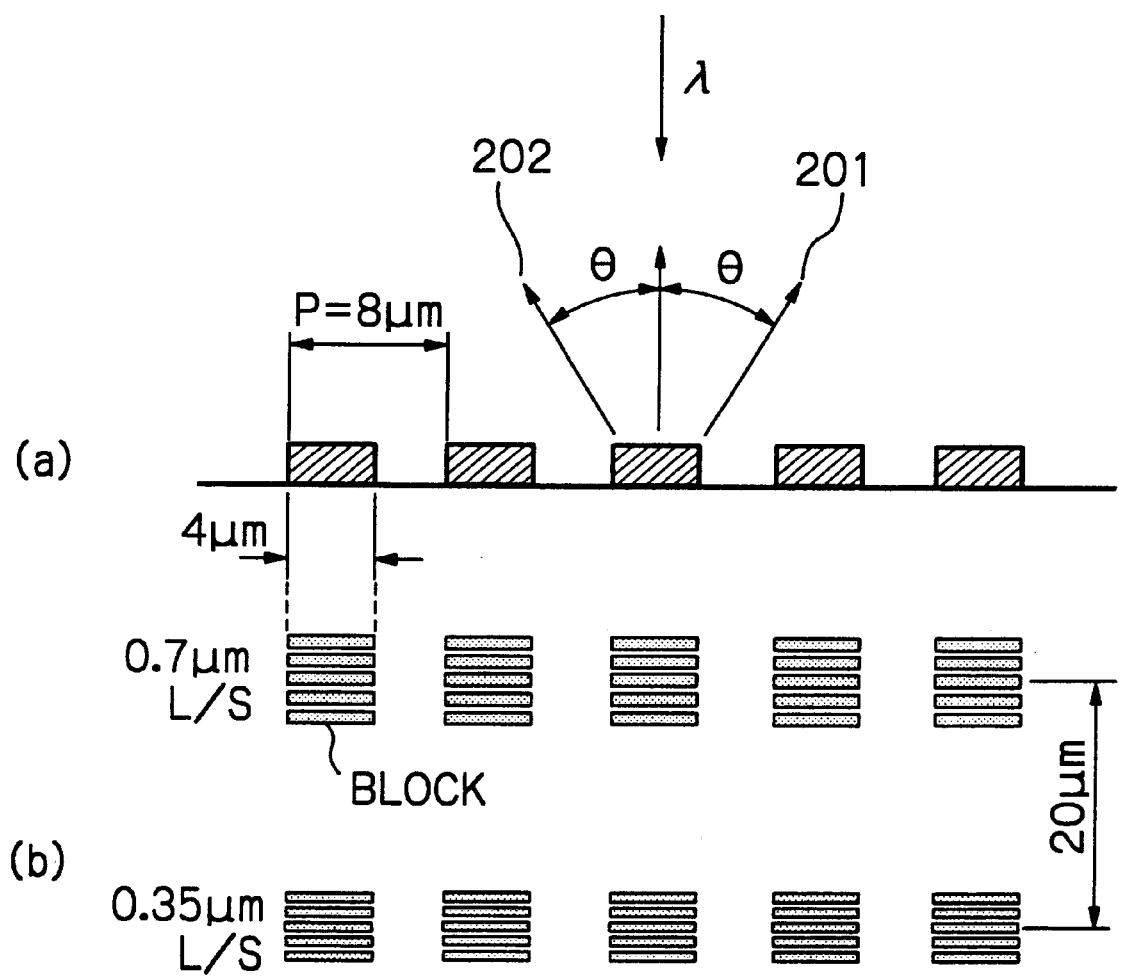
FIG. 14 is a view showing a relationship of the LSA mark with illuminating light.

FIG. 14 shows a relationship of a LSA mark with illuminating light. In this example, the LSA mark is formed with a line-and-space pattern of five line blocks disposed apart from each other at a pitch P of 0.8 μm in a lengthwise direction, each mark having a length of 4 μm, and each line block consisting of five dark lines with each line having a line width of 0.7 μm.

Another LSA mark is likewise formed with a line-and-space pattern of five blocks of a line-and-space pattern, each line having a line width of 0.35 μm, disposed apart at is a line pitch of 0.20 μm from and parallel to the above LSA mark. FIG. 14(a) is a side view and FIG. 14(b) is a plan view.

Then, these marks are irradiated with rays of light having a wavelength γ of, for example, 632.8 μm, thereby emitting diffracted light. The diffracted angle θ in a direction in which to emit the diffracted light can be given as follows:

$$P \sin \theta = n\lambda$$

where n is a degree.

Further, it can be noted that the direction in which to emit the diffracted light is a direction of the pitch P of the line block of the line-and-space pattern, as shown in FIG. 14. In FIG. 14, the diffracted light is shown so as for a plus primary light 201 and a minus primary light 202 to emit leftward and rightward, respectively, in the direction of the diffracted angle θ. The diffracted light can be received in a manner as will be described with reference to FIG. 15, thereby determining the position of a stepper stage from an interferometer.

More specifically, peaks of light intensities can be caused to appear due to the diffraction effect of the diffracted light between the adjacent blocks. In this case, a peak may become higher between the center lines of the blocks than the other. Therefore, by measuring the distance between the peaks, it can be determined how far the distance therebetween deviates from the original distance of the two adjacent blocks, i.e. from the original distance of 20 θm.

Figure 15:
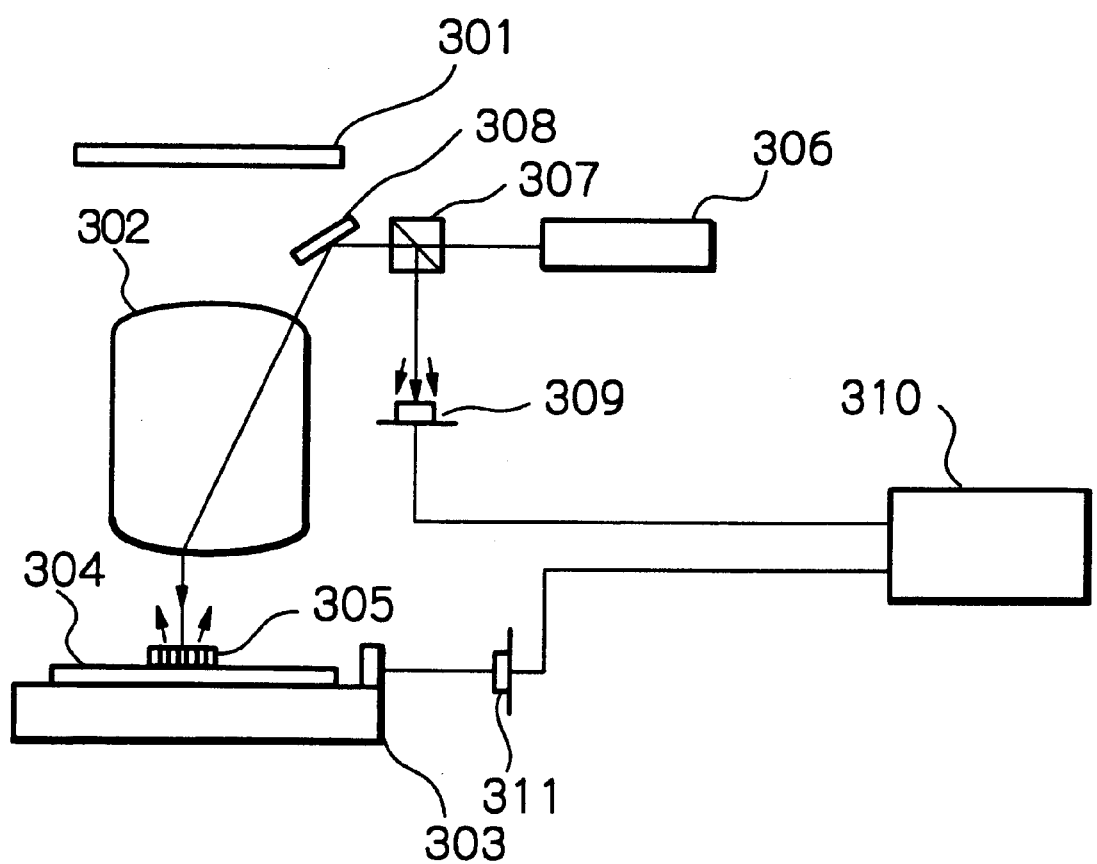
FIG. 15 is a schematic view for describing a measuring device for use in measurement with the LSA mark.

FIG. 15 shows a portion of a projection exposure apparatus, which comprises a projection lens system 302 disposed underneath a reticle 301 and a wafer stage 303 with a wafer 304 to be loaded at its imaging position. On a photoresist on the wafer 304 is to be formed an image of an LSA mark 305 formed on the reticle 301. The projection lens system is mounted with a laser device 306 in an obliquely upward position, which is disposed to irradiate laser beams toward the projection lens system. Laser beams then strike a mirror 308 through a beam splitter 307, followed by striking the projection lens system 302 where the beams are then diffracted in a direction in which they are sent to the LSA mark 305 at an angle substantially perpendicular thereto. As described hereinabove with reference to FIG. 14, the diffracted light is caused to occur at the LSA mark, however, the diffracted light is then allowed to pass through the projection lens system 302 again, followed by passing through the mirror 308 and reaching the beam splitter 308. The diffracted light reflected is then allowed to strike a light receipt section 309 disposed on the light path for receiving the diffracted light and detected. The diffracted light detected by the light receipt section is then photoelectrically converted into signals which are then transmitted to an operation section 310. The synchronous signals received by the light receipt section 311 of the interferometer of the stage are transmitted to the operation section 310, too. The signals sent are together subjected to operation processing, and the position of the image of the LSA mark is measured with high precision on the basis of the results of the operation processing.

In FIG. 14, five of the blocks constituting the LSA mark are shown, however, the blocks may be two or more, although seven or more of the blocks are preferred because the diffraction effect can be increased. If the distance, i.e. 20 μm as shown in FIG. 14, between the adjacent blocks of the line-and-space patterns, each line of one group having a line width different from a line width of each line of the other group, i.e. 0.7 μm and 0.35 μm, as shown in FIG. 14, can be determined accurately, it is not necessary to form a line-and-space pattern each line having the equal line width, as a reference pattern, with.

When the pattern as shown in FIG. 12 is used, other alignment sensors or measuring devices other than those as described hereinabove may also be used. Such may include, for example, FIA or register measurement device.

As shown in FIG. 13, there is shown a variation of the pattern as shown in FIG. 12. The pattern comprises a line-and-space pattern in which each line constituting one block of FIG. 12 is extended to be united with the corresponding line of the adjacent block thereof into one line. In other words, for example, the first group of the line-and-space pattern as shown in FIG. 12 comprises five straight lines and the other groups thereof may be likewise formed. This pattern is particularly suitable for the measurement by the FIA because the diffraction effect is not required when image processing is to be effected.

(Seventh Embodiment)

A seventh embodiment of the present invention will now be described with reference to FIG. 16.

FIG. 16 shows an example of a box pattern in accordance with a seventh embodiment of the present invention. As shown in FIG. 16(a), the box pattern may comprise an outer frame and an inner frame, each in a square shape. The outer square frame may comprise five larger dark lines disposed concentrically with each other in the form of a line-and-space pattern, each line having the equal line width. Likewise, the inner square frame may comprise five smaller dark lines disposed concentrically with each other in the form of a line-and-space pattern, each line having the equal line width smaller than the line width of each line of the outer square frame. The inner square frame is further disposed inside the outer square frame so as to be located concentrically with the outer square frame. Hence, each side of the outer square frame is disposed parallel to the corresponding side of the inner square frame. Further, as the line width of each square line of the outer square frame differs from that of each square line of the inner square frame, an amount of movement of a resist image of the outer square frame differs from that of a resist image of the inner square frame so that the outer and inner square frames become eccentric from each other so that an eccentric amount is to be measured. On the other hand, FIG. 16(b) shows an example of a box pattern consisting of an outer square frame and an inner square frame. The outer square frame may comprise an isolated line pattern consisting of one larger dark line in a square form. The inner square frame may likewise comprise an isolated line pattern consisting of one smaller dark line in a square form. The outer square frame and the inner square frame are disposed concentrically with each other so that each side of the outer square frame is parallel to each corresponding side of the inner square frame. In this case, as there is a difference in line width of each line between the outer square frame and the inner square frame, an amount of movement of a resist image of the outer square frame differs from that of a resist image of the inner square frame so that the outer and inner square frames may become eccentric with each other. An amount of eccentricity is likewise to be measured. In both cases, unlike the examples as described hereinabove, the outer square frame consisting of the larger line pattern may be replaced with the inner square frame consisting of the smaller line pattern. In other words, the outer square frame may comprise a larger line pattern and the inner square frame may comprise a smaller line pattern, as shown in FIGS. 16(a) and 16(b).

In those cases, too, the outer square frame may be disposed concentrically with the inner square frame in an accurate way or, even if not, it can be acceptable as long as a relationship of the position of the outer square frame with the position of the inner square frame is determined with high precision. In those cases, no reference pattern is required because it is not necessary to expose different patterns each formed on the mask in a superimposed manner. Even if the outer square frame is not located concentrically with the inner square frame in an accurate way, an amount of eccentricity between the outer and inner square frames is to be measured and a measured amount of the deviation can be corrected by the amount of eccentricity.

Although the above description has been made with reference to the drawings showing the positive patterns, it can likewise be applied to a negative pattern.

The pattern for measurement is not restricted to those as shown in the drawings and may include any line-and-space pattern extending in a predetermined constant direction. Further, the number of lines may be one or plural. In particular, when the number of lines is three or more, it is preferred to measure the position or positions of the line or lines remained with the two lines locating on the outermost sides in the pitch direction of the pattern excluded therefrom. This is in order to avoid an impact of an illuminating light flux.

Figure 6:
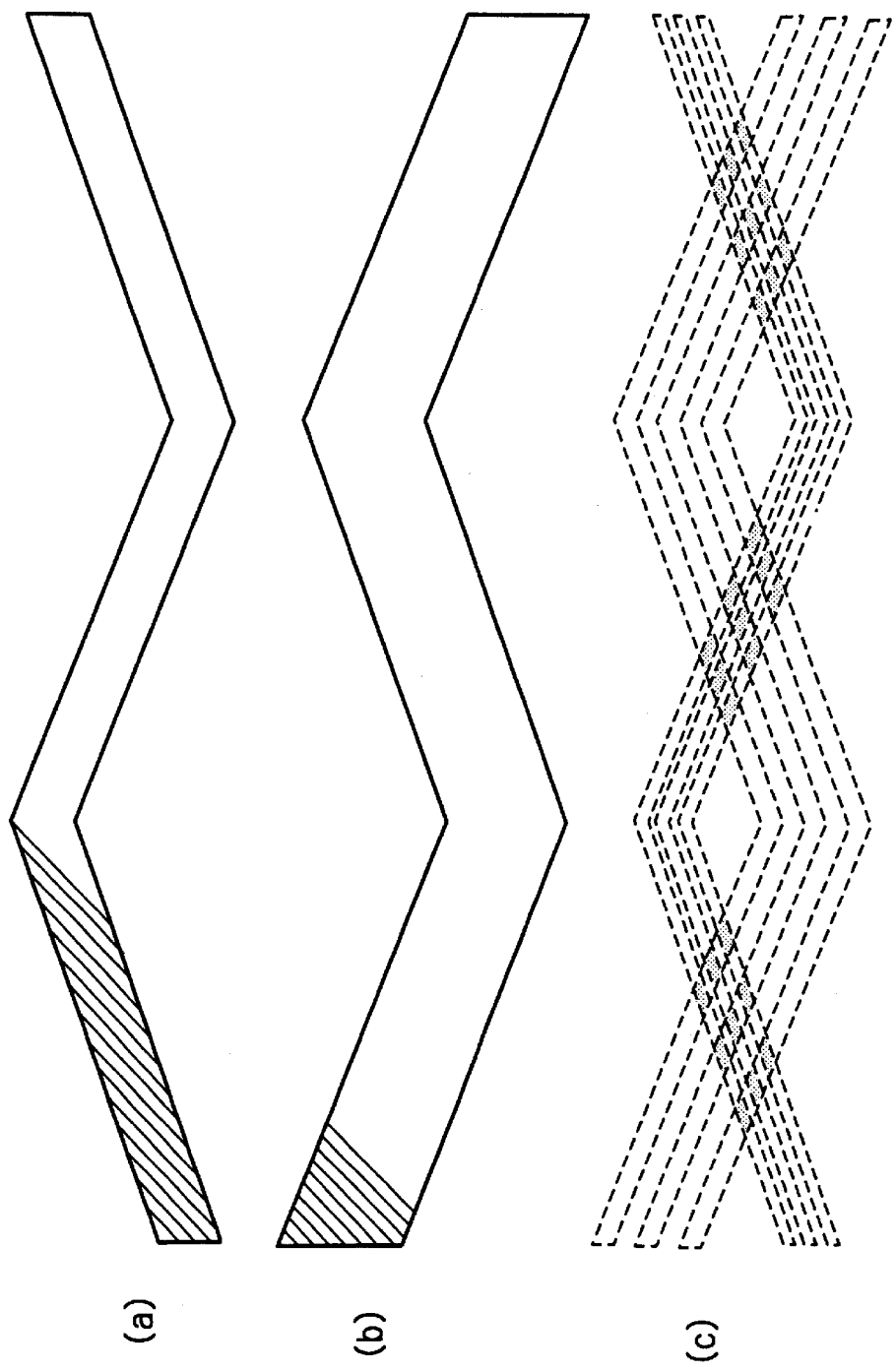
FIG. 6 is a view showing a light shade pattern to be used for clearly measuring a Moire mark for use in the working examples of the present invention.

It is described hereinabove that, in the case where the pattern is a line-and-space pattern, it is preferred to measure an amount of the deviation of one center line or plural central lines locating in the middle portion of the line-and-space pattern, not the lines locating on the end sides thereof. From the viewpoint of actual measurement, it is more preferred for measurement in the case where the images of the lines on the both end sides are excluded from the resist image. FIG. 6 shows this embodiment of the present invention. It should be noted herein that the line-and-space pattern in this case be a positive pattern.

FIG. 6(a) shows an example of a light shade pattern covering the three central lines of the line-and-space pattern consisting of the five dark lines of FIG. 5(a). FIG. 6(b) shows an example of a light shade pattern covering the three central lines of the line-and-space pattern consisting of the five dark lines of FIG. 5(b).

When the light shade pattern of FIG. 6(a) is superimposed on the light shade pattern of FIG. 6(b) and they are exposed after the superimposition and exposure as shown in FIG. 5(c), the lines on the both end sides of each of the line-and-space patterns are exposed to light and caused to disappear, as shown in FIG. 6(c), thereby leaving only the images of the three remaining central lines. This allows an accurate measurement of the deviation of the positions of the lines.

The objects for measurement in accordance with the present invention may include, for example, an optical reflection-refraction system as well as an optical projection-refraction system. It is to be further noted that it is not necessary to share the configuration of the exposure apparatus with a measuring device and to use an apparatus designed for exclusive use in measurement.

Further, in the embodiments as described hereinabove, the aberration is determined by measuring the resist image of the pattern after development. It can be noted that the measurement can also be carried out in the stage of latent image by using, for example, a thermoplastic resin, photochromic material or the like as a photosensitive substrate. Moreover, the shape of a pattern image may be measured by utilizing pixels of image pickup elements, such as CCD, mounted on the wafer stage WF.

In addition, the present invention can also make it possible to immediately correct the asymmetrical aberration at site by a given correction function as the asymmetrical aberration has been found upon inspection of the optical projection system of the exposure apparatus in process of manufacturing on an actual production line.

What is claimed is:

1. An aberration measurement method for the measurement of an amount of an aberration of an optical projection system, comprising:

locating a mask in an optical path of the optical projection system, the mask being formed with a line-and-space pattern containing lines, each line having a substantially equal line width;

locating a substrate in a projection position of the optical projection system;

exposing the line-and-space pattern to the substrate at a predetermined amount of exposure by the optical projection system;

measuring a difference in displacement amount between line widths of the lines of the pattern on the both sides in the pitch direction of the line-and-space pattern images formed on the substrate; and determining an amount of aberration of the optical projection system on the basis of a relationship between a predetermined amount of aberration and a displacement of line widths, and the measured difference in displacement amount between line widths.

2. The aberration measurement method as claimed in claim 1, wherein the relationship between the predetermined amount of aberration and the displacement of line widths is stored in a memory.

3. An aberration measurement method for the measurement of an amount of an aberration of an optical projection system, comprising:

locating a mask in an optical path of the optical projection system, the mask being formed with a line-and-space pattern containing lines, each line having a substantially equal line width;

locating a substrate in a projection position of the optical projection system;

exposing the line-and-space pattern to the substrate by varying an amount of exposure and a position of exposure by the optical projection system;

measuring a ratio of a first amount of exposure to a second amount of exposure, the first amount of exposure being an exposure amount in which an image of a one line of the lines on both pitchwise ends of the line-and-space pattern disappears and the second amount of exposure being an exposure amount in which an image of an other line of the lines on both pitchwise ends of the line-and-space pattern disappears, in the line-and-space pattern images formed on the substrate; and determining an amount of aberration of the optical projection system on the basis of a relationship between a predetermined amount of aberration and a ratio of an amount of exposure, and the measured ratio.

4. An aberration measurement method for the measurement of an amount of an aberration of an optical projection system, comprising:

locating a mask in an optical path of the optical projection system, the mask being formed with plural groups of line-and-space patterns, each line-and-space pattern group containing plural lines with each line having a different line width from each other;

locating a substrate in a projection position of the optical projection system;

exposing the patterns to the substrate at a predetermined amount of exposure by the optical projection system;

measuring a pitchwise width of an image of each line-and-space pattern group, the each line-and-space pattern group being formed on the substrate; and determining an amount of aberration of the optical projection system on the basis of the measured pitchwise width of the image of each line-and-space pattern group.

5. The aberration measurement method as claimed in claim 4, wherein the plural lines each having a different line width are disposed on both sides in a pitchwise direction of the line-and-space pattern having the lines with equal line widths.

6. An aberration measurement method for the measurement of an amount of an aberration of an optical projection system comprising:

exposing a line-and-space pattern containing lines each having a substantially equal line width and a wedge-shaped pattern disposed on each of both pitchwise end sides of the line-and-space pattern, the wedge-shaped pattern being so formed as for its line width to vary gradually in a lengthwise direction of the line, to a predetermined plane at a predetermined amount of exposure by the optical projection system; and determining an amount of an aberration on the basis of information in respect of a shape of the wedge-shaped pattern in the image of the pattern formed on the predetermined plane.

7. The aberration measurement method as claimed in claim 6, wherein said information in respect to the shape of the wedge-shaped pattern is information on a positions in which line widths of the wedge-shaped patterns become equal to each other in a lengthwise direction of the pattern.

8. The aberration measurement method as claimed in claim 6, wherein said information in respect to the shape of the wedge-shaped pattern is information on a length of the wedge-shaped pattern.

9. The aberration measurement method as claimed in claim 6, wherein said wedge-shaped pattern has a constant line width in a predetermined distance in its lengthwise direction and the line width of the wedge-shaped pattern varies stepwise as a whole.

10. The aberration measurement method as claimed in claim 6, wherein said predetermined plane is a substrate coated with a photoresist.

11. An aberration measurement method for the measurement of an amount of an aberration of an optical projection system, comprising:

exposing a line-and-space pattern containing lines each having an equal line width and a wedge-shaped pattern disposed on each of both pitchwise end sides of the line-and-space pattern, the wedge-shaped pattern being so formed as for its line width to vary gradually in a lengthwise direction of the line, to the predetermined plane by varying an amount and a position of exposure by the optical projection system; and determining an amount of an aberration on the basis of a ratio of a first amount of exposure to a second amount of exposure, the first amount of exposure being an exposure amount in which an image of a one pattern of the wedge-shaped pattern disappears and the second amount of exposure being an exposure amount in which an image of an other pattern of the wedge-shaped pattern disappears, in the position of exposure formed on the predetermined plane.

12. A mask for an optical projection system having a first line-and-space pattern group formed thereon, the first line-and-space pattern group having a first line-and-space pattern, a second line-and-space pattern and a third line-and-space pattern formed in a zigzag pattern, the first line-and-space pattern containing lines having each line of the predetermined line width WA disposed parallel to and linearly symmetrically to the first virtual center line intersecting with the optional virtual reference line LA0 at the angel α not larger than 45°, the second line-and-space pattern containing lines having each line of the predetermined line width WA disposed parallel to and linearly symmetrically to the second virtual center line intersecting at the angle −α at the intersection point YA on the virtual reference line LA0 apart in the predetermined distance LN1 from the intersection point XA intersecting the virtual reference line LA0 with the first virtual center line, and the third line-and-space pattern containing lines having each line of the predetermined line width WA disposed parallel to and linearly symmetrically to the third virtual center line intersecting at the angle α at the intersection point ZA on the virtual reference line LA0 apart in the predetermined distance LN1 from the intersection point YA.

13. A mask set for an optical projection system comprising:

the mask for the optical projection system as claimed in claim 12; and another mask being formed with a second line-and-space pattern group having a fourth line-and-space pattern, a fifth line-and-space pattern and a sixth line-and-space pattern formed in a zigzag pattern, the fourth line-and-space pattern containing lines with each line of the predetermined line width WB disposed parallel to and linearly symmetrically to the fourth virtual center line intersecting with the optional virtual reference line LB0 at an angle −α not larger than 45°, the fifth line-and-space pattern containing lines with each line of the predetermined line width WB disposed parallel to and linearly symmetrically to the fifth virtual center line intersecting at the angle α at the intersection point YB on the virtual reference line LB0 apart in the predetermined distance LN2 from the intersection point XB between the virtual reference line LB0 and the fourth virtual center line, and the sixth line-and-space pattern containing lines with each line of the predetermined line width WB disposed parallel to and linearly symmetrically to the sixth virtual center line intersecting at the angle α at the intersection point ZB on the virtual reference line LB0 apart in the predetermined distance LN2 from the intersection point YB.

14. The mask set for an optical projection system as claimed in claim 12, further comprising:

the one mask being further formed with a third line-and-space pattern group in the position different from the position of the first line-and-space pattern group, the third line-and-space pattern group containing a seventh line-and-space pattern, an eighth line-and-space pattern and a ninth line-and-space pattern formed in a zigzag pattern, the seventh line-and-space pattern group containing lines having each line of the predetermined line width WC disposed parallel to and linearly symmetrically to the seventh virtual center line intersecting at the optional angle β with the optional virtual reference line LC0 parallel to the virtual reference line LA0 and apart in the predetermined distance LN11 therefrom, the eighth line-and-space pattern containing lines having each line of the predetermined line width WC disposed parallel to and linearly symmetrically to the eighth virtual center line intersecting at the angle −β at the intersection point YC on the virtual reference line LC0 apart in the predetermined distance LN3 from the intersection point YC between the virtual reference line LC0 and the seventh virtual center line, and the ninth line-and-space pattern containing lines having each line of the predetermined line width WC disposed parallel to and linearly symmetrically to the ninth virtual center line intersecting at the angle β at the intersection point ZC on the virtual reference line LC0 apart in the predetermined distance LN3 from the intersection point YC.

15. The mask set for an optical projection system as claimed in claim 14, wherein the other mask is further formed with a fourth line-and-space pattern group in a position different from a position of said second line-and-space pattern group in a manner that the fourth line-and-space pattern group is disposed parallel to and linearly symmetrically to said third line-and-space pattern group and said virtual reference line LC0 and said virtual reference line LC0 comes substantially in agreement with a virtual reference line LD0 parallel to said virtual reference line LB0 and apart in a predetermined distance LN12.

16. A method for measuring an aberration of an optical projection system, comprising:

forming a measuring pattern image in a predetermined pitch by said optical projection system;

measuring line widths of patterns on both end sides of the measuring pattern image in its pitchwise direction; and determining an amount of the aberration on the basis of a relationship between a predetermined amount of aberration and a line width, and the measured line widths.

17. A method for measuring an aberration of an optical projection system, comprising:

forming plural measuring pattern images having different line widths by said optical projection system;

measuring positions of the measuring pattern images which vary in relation to the line width due to the aberration of the optical projection system; and determining an amount of the aberration of the optical projection system on the basis of the measured positions of the measuring pattern images.

18. The method for measuring an aberration of an optical projection system as claimed in claim 17, wherein:

said plural measuring patterns are at least two line-and-space patterns having different line widths.

19. The method for measuring an aberration of an optical projection system as claimed in claim 17, wherein:

said plural measuring patterns comprise a box pattern comprising an inner frame and an outer frame, the inner frame and the outer frame having different line widths.

20. An aberration measurement method for the measurement of an amount of an aberration of an optical projection system, comprising:

forming an image of a first pattern and an image of a second pattern on a predetermined plane by exposure through the optical projection system, said second pattern being different from said first pattern;

measuring a position of the image of said first pattern and a position of the image of said second pattern on the predetermined plane; and measuring an amount of an aberration of said optical projection system on the basis of an amount of deviation between the measured positions of the images of said first and second patterns, wherein said first pattern is a line-and-space pattern and said second pattern is an isolated line pattern.

21. An aberration measurement method for the measurement of an amount of an aberration of an optical projection system, comprising:

forming an image of a first pattern and an image of a second pattern on a predetermined plane by exposure through the optical projection system, said second pattern being different from said first pattern;

measuring a position of the image of said first pattern and a position of the image of said second pattern on the predetermined plane; and measuring an amount of an aberration of said optical projection system on the basis of an amount of deviation between the measured positions of the images of said first and second patterns, wherein said first pattern is one member selected from a line-and-space pattern and an isolated line pattern, each having a predetermined line width, and said second pattern is one member selected from a line-and-space pattern and an isolated line pattern, each having a line width different from the predetermined line width.

22. The aberration measurement method as claimed in claim 21, wherein said first pattern and said second pattern have each line parallel to each other.

23. An aberration measurement method for the measurement of an amount of an aberration of an optical projection system, comprising:

forming an image of a first pattern and an image of a second pattern on a predetermined plane by exposure through the optical projection system, said second pattern being different from said first pattern;

measuring a position of the image of said first pattern and a position of the image of said second pattern on the predetermined plane; and measuring an amount of an aberration of said optical projection system on the basis of an amount of deviation between the measured positions of the images of said first and second patterns, wherein an image of a third pattern is formed on the predetermined plane, said third pattern having a line width substantially equal to a line width of said second pattern and wherein in said measuring of the amount of the aberration, an amount of deviation between the position of the image of said first pattern and the position of the image of said second pattern is corrected on the basis of the position of the image of said second pattern and a position of the image of said third pattern, and the amount of the aberration of the optical projection system is measured after the correction.

24. An aberration measurement method for the measurement of an amount of an aberration of an optical projection system, comprising:

forming an image of a first pattern and an image of a second pattern on a predetermined plane by exposure through the optical projection system, said second pattern being different from said first pattern;

measuring a position of the image of said first pattern and a position of the image of said second pattern on the predetermined plane; and measuring an amount of an aberration of said optical projection system on the basis of an amount of deviation between the measured positions of the images of said first and second patterns, wherein said first pattern is formed on a first mask, together with a third pattern having a line width different from line widths of said first and second patterns, while said second pattern is formed on a second mask, together with a fourth pattern having a line width substantially equal to the line width of the third pattern, and wherein in said measuring of the amount of the aberration, an amount of deviation between the position of the image of said first pattern and the position of the image of said second pattern is corrected on the basis of the position of the image of said second pattern and the position of an image of said third pattern, and the amount of the aberration of the optical projection system is measured after the correction.

25. The aberration measurement method as claimed in claim 24, wherein said first mask is formed with the first and third patterns so as for lines thereof to be disposed parallel to each other and said second mask is formed with the second and fourth patterns so as for lines thereof to be disposed parallel to each other; and said forming of the images of the patterns comprises locating each mask so as to make each line of each pattern of each mask parallel to each other.

26. The aberration measurement method as claimed in claim 24, wherein said first pattern comprises a first line-and-space pattern group having a plurality of line-and-space patterns formed in a zigzag pattern while said second pattern comprises a second line-and-space pattern group having a plurality of line-and-space patterns formed in a zigzag pattern, the plurality of line-and-space patterns of said second line-and-space pattern group having a line width different from a line width of the plurality of line-and-space patterns of said first line-and-space pattern group, and wherein said first pattern is formed on the first mask, together with a third line-and-space pattern group having a line width different from the line widths of the first and second line-and-space pattern groups while said second pattern is formed on the second mask, together with a fourth line-and-space pattern group having aline width substantially equal to the line width of the third line-and-space pattern group.

27. An aberration measurement method for the measurement of an amount of an aberration of an optical projection system, comprising:

forming an image of a first pattern and an image of a second pattern on a predetermined plane by exposure through the optical projection system, said second pattern being different from said first pattern;

measuring a position of the image of said first pattern and a position of the image of said second pattern on the predetermined plane; and measuring an amount of an aberration of said optical projection system on the basis of an amount of deviation between the measured positions of the images of said first and second patterns, wherein said first pattern comprises a first line-and-space pattern group having a plurality of line-and-space patterns formed in a zigzag pattern while said second pattern comprises a second line-and-space pattern group having a plurality of line-and-space patterns formed in a zigzag pattern, the plurality of line-and-space patterns of said second line-and-space pattern group having a line width different from a line width of the plurality of line-and-space patterns of said first line-and-space pattern group.

* * * * *